United States Patent
Esaki et al.

(10) Patent No.: US 7,181,089 B2
(45) Date of Patent: Feb. 20, 2007

(54) METHOD AND APPARATUS FOR SEARCHING FOR FIDUCIAL MARKS, AND METHOD OF DETECTING POSITIONS OF THE FIDUCIAL MARKS

(75) Inventors: Hirotake Esaki, Inazawa (JP); Baksa Chi, Chiryu (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 679 days.

(21) Appl. No.: 10/235,932

(22) Filed: Sep. 6, 2002

(65) Prior Publication Data

US 2003/0053714 A1 Mar. 20, 2003

(30) Foreign Application Priority Data

Sep. 14, 2001 (JP) ............................. 2001-280303

(51) Int. Cl.
*G06K 9/36* (2006.01)
*G06K 9/00* (2006.01)

(52) U.S. Cl. ..................................... 382/287
(58) Field of Classification Search ............... 382/287, 382/288, 291, 145, 151

See application file for complete search history.

(56) References Cited

U.S. PATENT DOCUMENTS

| | | | |
|---|---|---|---|
| 5,953,447 A * | 9/1999 | Jin | 382/145 |
| 6,240,218 B1 * | 5/2001 | Michael et al. | 382/289 |
| 6,681,039 B1 * | 1/2004 | Roberts et al. | 382/151 |
| 6,798,925 B1 * | 9/2004 | Wagman | 382/287 |

* cited by examiner

*Primary Examiner*—Amir Alavi
(74) *Attorney, Agent, or Firm*—Oliff & Berridge, PLC

(57) ABSTRACT

Method and apparatus for searching for a fiducial mark, by processing image data indicative of images of the fiducial mark and an area surrounding the fiducial mark, which images are taken by an imaging device, wherein the image data are processed by an image-data processing device, which includes: a reference-line data storing portion operable perform a step of storing at least one reference line each of which corresponds to at least one portion of a profile of the fiducial mark and the number of which is sufficient to specify the fiducial mark; a profile-data obtaining portion operable to perform a step of obtaining profile data indicative of profiles of the images taken by the imaging device, each of the profiles of the images consisting of a group of points at which an optical characteristic of the corresponding image abruptly changes; and a searching portion operable to perform a step of searching for the fiducial mark, on the basis of the profiles represented by the obtained profile data and the stored at least one reference line.

11 Claims, 13 Drawing Sheets

REFERENCE REGION DEFINED BY DISPLACING REFERENCE LINES

REFERENCE REGION DEFINED BY DISPLACING REFERENCE LINES

500

OUTWARDLY DISPLACED REFERENCE LINE

+t

−t

REFERENCE LINE

INWARDLY DISPLACED REFERENCE LINE

+t   −t

Y
X

METHOD AND APPARATUS FOR SEARCHING FOR FIDUCIAL MARKS, AND METHOD OF DETECTING POSITIONS OF THE FIDUCIAL MARKS

The present application is based on Japanese Patent Application No. 2001-280303 filed Sep. 14, 2001, the content of which is incorporated herein by reference.

BACKGROUND OF THE INVENTION

1. Field of the Invention

The present invention relates in general to a method of and an apparatus for searching for a fiducial mark, and more particularly to a fiducial-mark search on the basis of an image.

2. Discussion of Related Art

For example, fiducial-marks are provided on a circuit substrate (e.g., a printed-wiring board) on which electric components (typically, electronic components) are to be mounted. The fiducial marks are used to detect errors of positioning (hold-position errors) of the circuit substrate as held by a circuit-substrate holding device. In an electric-component mounting system arranged to mount the electric components on the circuit substrate, an imaging device is usually provided to take images of the fiducial marks provided on the circuit substrate, and the positions of the fiducial marks are detected on the basis of image data indicative of the images of the fiducial marks. The thus detected positions of the fiducial marks are compared with nominal positions of the fiducial marks, to detect the hold-position errors of the circuit substrate. When the images of the fiducial marks are taken, areas surrounding or near the fiducial marks are also imaged, so that the images taken must be searched to find the images of the fiducial marks. Namely, the images of the fiducial marks must be distinguished from the images of the surrounding areas. To this end, search patterns are conventionally used.

The fiducial marks used have different shapes or configurations, so that there are prepared a plurality of different reference patterns, one of which has the same shape as the desired mark-mark to be searched for is selected by the operator of the system. The operator then manipulates an input device to supply a control device with data indicative of the dimensions of predetermined portions of the selected reference pattern. When a search for the fiducial-mark in question is made, a search pattern is generated on the basis of the selected reference pattern and its dimensional data, so that the search is made using the generated search pattern. One of the images taken by the imaging device, which matches most the search pattern, is determined as the fiducial mark in question.

Where the number of mark marks having respective different shapes is comparatively small, appropriate search patterns can be easily generated using the reference patterns. Where the number of fiducial marks having different shapes is comparatively large, it is difficult to prepare the reference patterns for all of the fiducial marks having the different shapes. If the reference patterns for some of the fiducial marks are not available, the search patterns for these fiducial marks cannot be generated.

SUMMARY OF THE INVENTION

The present invention was made in view of the problems encountered in the prior art described above. It is therefore an object of the present invention to permit a search for any one of a multiplicity of fiducial marks having respective different shapes. This object may be achieved according to any one of the following modes of the present invention, in the form of a fiducial-mark searching method, a fiducial-mark searching apparatus or a fiducial-mark-position detecting method, each of which is numbered like the appended claims and depends from the other mode or modes, where appropriate, for easier understanding of technical features disclosed in the present application and possible combinations of those features. However, it is to be understood that the invention is not limited to those technical features or combinations thereof, and that any one of a plurality of technical features described below with respect to any one mode of the invention may be a subject of the present invention, without the other technical feature or features being combined with the above-indicated one feature.

(1) A method of searching for a fiducial mark, by processing image data indicative of images of the fiducial mark and an area surrounding the fiducial mark, the images being taken by an imaging device, the method comprising the steps of:

a reference-line setting step of setting at least one reference line each of which corresponds to at least one portion of a profile of the fiducial mark and the number of which is sufficient to specify the fiducial mark;

a profile-data obtaining step of obtaining profile data indicative of profiles of the images taken by the imaging device, each of the profiles of the images consisting of a group of points at which an optical characteristic of the corresponding image abruptly changes; and a searching step of searching for the fiducial mark, on the basis of the profiles represented by the obtained profile data and the at least one reference line.

The fiducial mark may be provided on a circuit substrate, a holder holding a screen-printing screen or stencil, and feeders of a component-supplying device, for example, and on various other object.

The fiducial mark is formed such that an optical characteristic of an image of the fiducial mark abruptly or suddenly changes at a profile of the image. The fiducial mark may be formed by printing, or provided by attaching a label to the object by a suitable bonding or adhesive agent, or by forming a raised portion on or a recessed portion in a surface of the object. The fiducial mark may be flush with the surface of the object. The optical characteristic may be the brightness or color hue. Where the imaging device is a color imaging device, the profile of each image can be detected on the basis of a change in the color hue of the image.

Each of the at least one reference line corresponds to the entire portion of the profile of the fiducial mark, or only a portion of the profile.

The profile of the fiducial mark, which is defined by at least one line segment, may be specified at least one reference line which corresponds to only a portion of the profile. The profile of the fiducial mark may be specified by a single reference line corresponding to the entirety of the profile. However, a single reference line corresponding to only a portion of the profile may specify this profile. Further, the profile may be specified by a plurality of reference lines which corresponds respective portions of the profile. Thus, the profile of the fiducial mark may be specified or defined by a single reference line corresponding to a portion of the profile, or a combination of a plurality of reference lines corresponding to the respective portions of the profile. According to the present method, the at least one reference line is used to facilitate a search for the desired fiducial mark, by scanning the profile data, even where the object is provided with a large number of fiducial marks of different configurations or geometries.

(2) The method according to the above mode (1), wherein the reference-line setting step comprises setting a plurality of reference lines corresponding to respective portions of the profile of said fiducial mark.

(3) The method according to the above mode (1) or (2), wherein the reference-line setting step comprises setting the at least one reference line which is selected from a group consisting of: a circle; a circular arc; a polygon; a segment; and a bent line.

(4) The method according to the above mode (2) or (3), wherein the reference-line setting step comprises specifying positions of the plurality of reference lines relative to each other.

The positions of the reference lines relative to each other are specified by specifying a position of a predetermined portion of each reference line, or a direction of orientation or an angle of each reference line, or alternatively a distance between predetermined points of the reference lines.

(5) The method according to any one of the above modes (1)–(4), wherein the reference-line setting step comprises specifying at least one dimension of each of the at least one reference line.

The dimension or dimensions of each reference line may be specified in a manner suitable to represent the size of the reference line. For instance, where a square is used as a reference line, the length of each side of the square is specified. Where a circle is used as a reference line, the diameter of the circle is specified. Each dimension may be specified in a predetermined unit, or in a selected one of a plurality of predetermined units, or alternatively specified by the number of picture elements of an imaging screen of the imaging device.

(6) The method according to any one of the above modes (1)–(5), wherein the searching step comprises searching for the fiducial mark, on the basis of the profiles represented by the profile data obtained in the profile-data obtaining step, and the at least one reference line as displaced so as to effect at least one of predetermined permissible ratios of enlargement and contraction of a profile defined by the at least one reference line before displacement thereof.

In fiducial-mark searching method according to the above mode (6), each of the profiles represented by the profile data obtained in the profile-data obtaining step is compared with the at least one reference line which has been displaced so as to enlarge and/or contract the profile defined by the at least one reference line before displacement thereof. In this case, the profile represented by the profile data is determined to be the profile of the fiducial mark, even if the profile represented by the profile data more or less deviates from the profile defined by the original at least one reference line. For instance, each of the at least one reference line is gradually displaced in the direction of enlargement or contraction of the profile of the original at least one reference line, in increment of a predetermined amount of enlargement or contraction. If one of the profiles represented by the profile data substantially matches the displaced at least one reference line before the predetermined maximum ratio of contraction or contraction has been reached, this profile is determined to be the profile of the fiducial mark. Alternatively, each of the at least one reference line is displaced in the direction of enlargement and in the direction of contraction by predetermined distances corresponding to the permissible maximum ratios of enlargement and contraction, so as to define a permissible reference region. If one of the profiles represented by the profile data lies in this permissible reference region, this profile is determined to be the profile of the fiducial mark. When the surface area defined by the original at least one reference line as set in the reference-line setting step is smaller than the surface area defined by the displaced at least one reference line, the profile defined by the original at least one reference line is enlarged by the displacement of the original at least one reference line. When the former surface area is larger than the latter surface area, the profile defined by the original at least one reference line is contracted by the displacement of the original at least one reference line.

(7) The method according to any one of the above modes (1)–(6), wherein the searching step comprises determining one of the profiles represented by the profile data obtained in the profile-data obtaining step, to be a profile of the fiducial mark, if more than a predetermined percentage of the above-indicated one profile matches the at least one reference line.

Where a plurality of reference lines are set for one fiducial mark, there is a relatively high possibility that one of the profiles of the profile data substantially entirely matches or coincides with the reference lines. In this case, therefore, the above-indicated predetermined percentage of matching is selected to be close to 100%, for instance, determined to be 90%, 95%, 98% or 99%. Where a single reference line such as a polygon, a circle or any other closed loop is set for one fiducial mark, there is a relatively high possibility that any one of the profiles of the profile data does not entirely match the reference line, even where the profiles in fact include a profile of the fiducial mark. In this case, therefore, the predetermined percentage of matching is determined to be a comparatively low value, for instance, 80%, 85%, 90% or 95%. Where the feature of the present mode (7) is combined with the feature of the above mode (6), the profile which is represented by the profile data obtained in the profile-data obtaining step and which matches the displaced at least one reference line is determined to be the profile of the fiducial mark.

(8) The method according to any one of the above modes (1)–(7), wherein the fiducial mark is provided on a circuit substrate.

Examples of the circuit substrate include: a printed-wiring board on which no electric components have been mounted at any spots of a printed wiring formed on an electrically insulating substrate; a printed-wiring board on which electric components have been mounted at selected ones of the spots of the printed wiring and on which electric components are to be mounted at the other spots; and a printed-circuit board on which electric components have been mounted on one of its opposite surfaces with printing wirings formed thereon, and on which electric components are to be mounted on the other surface.

(9) A method of detecting a fiducial mark, comprising:
a fiducial-mark searching method according to any one of the above modes (1)–(8); and
a fiducial-mark-position obtaining step of obtaining a position of the fiducial mark which has been searched for by the fiducial-mark searching method.

The position of the fiducial mark provided on a given member can be used to obtain positioning errors or manufacturing errors of the member.

(10) An apparatus for searching for a fiducial mark, comprising an imaging device operable to take images of the fiducial mark and an area surrounding the fiducial mark, and an image-data processing device operable to process image data indicative of the images, the image-data processing device comprising:

a reference-line data storing portion operable to store at least one reference line each of which corresponds to at least one portion of a profile of the fiducial mark and the number of which is sufficient to specify the fiducial mark;

a profile-data obtaining portion operable to obtain profile data indicative of profiles of the images taken by the imaging device, each of the profiles of the images consisting of a group of points at which an optical characteristic of the corresponding image abruptly changes; and a searching portion operable to search for the fiducial mark, on the basis of the profiles represented by the profile data obtained by the profile-data obtaining portion and the at least one reference line stored in the reference-data storing portion.

The imaging device may be a surface-imaging device capable of obtaining two-dimensional images at one time, or a line sensor which includes a straight array of multiple imaging elements and which is moved relative to the objects (the fiducial mark and the surrounding area) to take a multiplicity of line images that collectively form two-dimensional images of the objects. The imaging device may be a full-color imaging device or a monochromatic imaging device.

The fiducial-mark searching apparatus according to the above mode (10) of the present invention has substantially the same advantages as the fiducial-mark searching method of the invention described above with respect to the above mode (1).

It is to be understood that the present fiducial-mark searching apparatus may incorporate any one of the features according to the above modes (2)–(9).

BRIEF DESCRIPTION OF THE DRAWINGS

The above and other objects, features, advantages and technical and industrial significance of the present invention will be better understood by reading the following detailed description of preferred embodiments of the invention, when considered in connection with the accompanying drawings, in which.

DETAILED DESCRIPTION OF THE PREFERRED EMBODIMENTS

Figure 1:
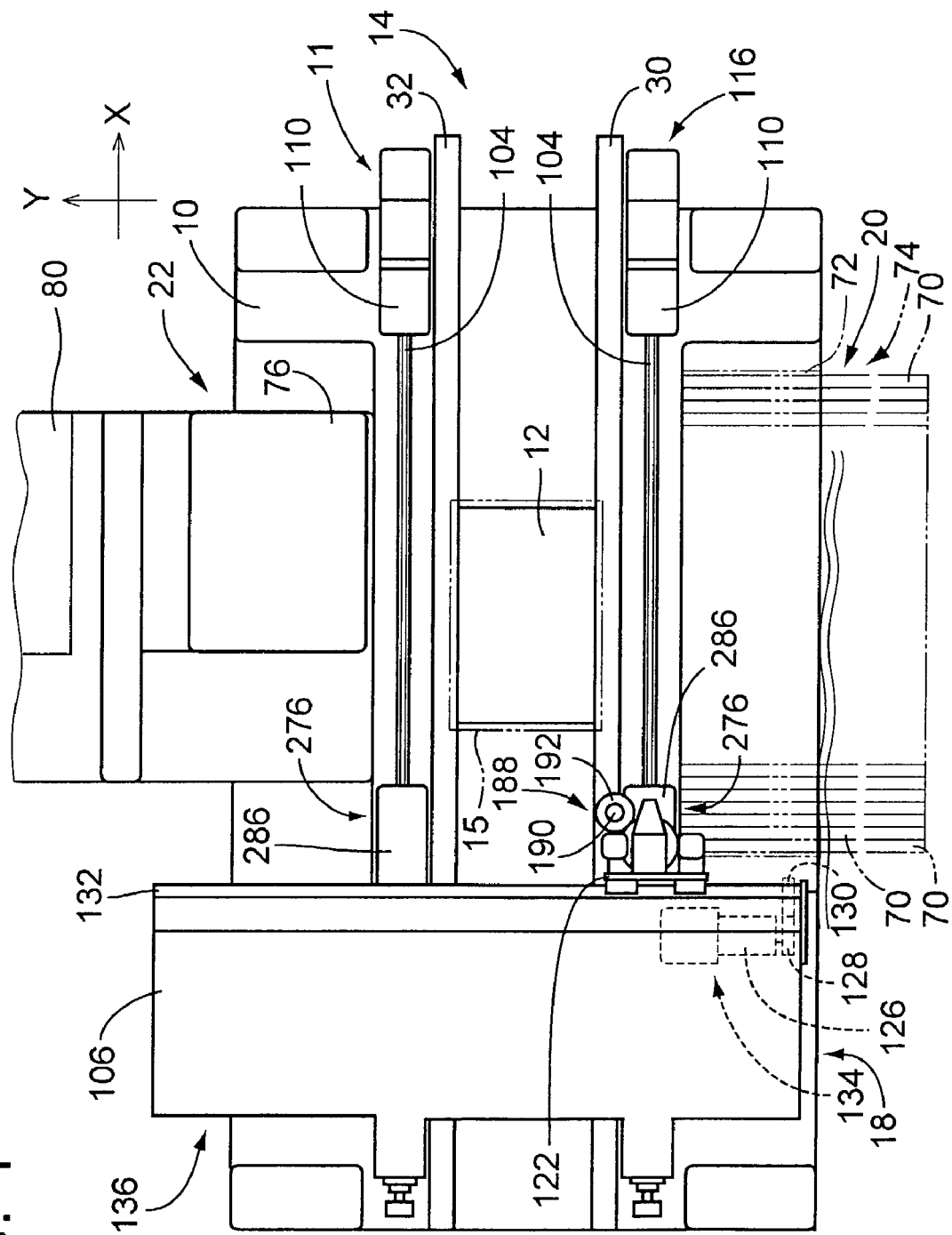
FIG. 1 is a plan view showing an electronic-component mounting system provided with a fiducial-mark searching apparatus constructed and operable to make a search for a fiducial mark according to one embodiment of this invention.

Referring to the drawings, there will be described in detail the preferred embodiments of the invention arranged to search for fiducial marks provided on circuit substrates in an electric-component mounting system provided with a fiducial-mark searching apparatus.

Referring first to FIG. 1, the electronic-component mounting system is shown generally at 11. The electronic-component mounting system 110 has a main body in the form of a machine base 10. The present mounting system 11 includes: a printed-wiring board conveyor (PWB conveyor) 14 operable to transfer or feed a circuit substrate in the form of a printed-wiring board 12 in an X-axis direction (in the left and right direction as seen in FIG. 1); a substrate-holding device in the form of a printed-wiring-board holding device (PWB holding device) 15 for holding the printed-wiring board 12; a component-mounting device 18 operable to mount electric components such as electronic components 16 (shown in FIG. 3) on the printed-wiring board 12; and component-supplying devices 20, 22 operable to supply the component-mounting device 18 with the electronic components 16. Those conveyor 14 and devices 15, 18, 20, 22 are mounted on the machine base 10.

In the present electronic-component mounting system 11, the printed-wiring board 12 is transferred by the PWB conveyor 14 such that the printed-wiring board 12 maintains a horizontal attitude or posture. The PWB conveyor 14 is stopped by a suitable stopper device (not shown), to locate the board 12 at a predetermined component-mounting position. The board 12 located at the component-mounting position is supported by the PWB holding device 15. In the present electronic-component mounting system 11, the printed-wiring board 12 is supported such that a component-mounting surface 28 (shown in FIG. 4) of the board 12 on which the electronic components 16 are mounted is parallel to the horizontal plane. The above-indicated X-axis direction is parallel to an X axis of an XY coordinate system in an XY plane parallel to the horizontal component-mounting surface 28.

As schematically shown in FIG. 1, the PWB conveyor 14 is provided with a pair of guide rails 30, 32 to guide respective endless conveyor belts (not shown) wound thereon. The printed-wiring board 12 placed on the conveyor belts is transferred by synchronized rotary motions of the conveyor belts by a suitable belt drive device (not shown).

Figure 2:
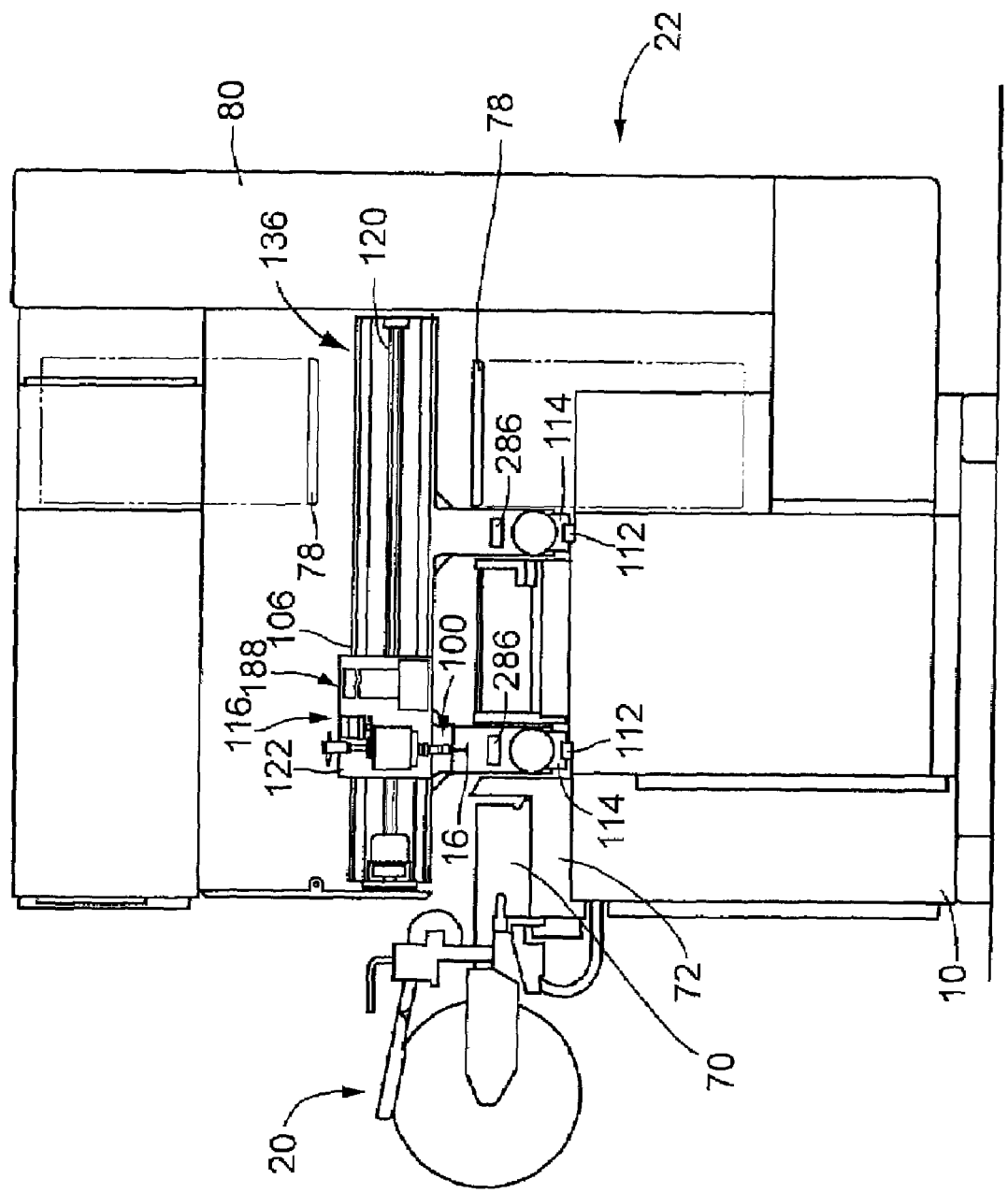
FIG. 2 is a side elevational view partly in cross section of the electronic-component mounting system of FIG. 1.

The component-supplying devices 20, 22 are spaced from each other in a Y-axis direction perpendicular to the X-axis direction, and fixedly disposed on the opposite sides of the PWB conveyor 14, as shown in FIGS. 1 and 2. In the present electronic-component mounting system 11, the component-supplying device 20 is of tape feeder type, while the component-supplying device 22 is of tray type.

The component-supplying device 20 of tape feeder type has a component-supply table 74, which includes a support block 72 and a multiplicity of tape feeders 70 that are mounted on the support block 72 such that the component-supply portions of the tape feeders 70 are arranged along a straight line parallel to the X-axis direction. Each of the tape feeders 70 uses a carrier tape accommodating a succession of electronic components 16. The carrier tape includes a substrate tape having a multiplicity of component-accommodating recesses, which are formed at a predetermined spacing interval in the longitudinal direction of the substrate tape and which accommodate the respective electronic components 16. The openings of the recesses in the substrate tape are closed by a covering tape, to thereby prevent removal of the electronic components 16 from the recesses while the carrier tape is fed at a predetermined pitch in the Y-axis direction. The electronic components 16 are successively fed to the component-supply portion of the tape feeder 70, while the covering tape is separated from the leading end portion of the substrate tape.

The component-supplying device 22 of tray type includes a multiplicity of component trays 76 as shown in FIG. 1. The component trays 76, which accommodate the electronic components 16, are accommodated in respective multiple tray boxes 78, which are arranged in a vertical stack and are supported by respective support members. The tray boxes 78 are elevated one after another by an elevator device disposed within a column 80, to a predetermined component-supply position. For a mounting head 100 (which will be described) to receive the electronic components 16 from the component tray 76 in the tray box 78 located at the component-supply position, some vertical space must be provided above the component-supply position. To provide this vertical space, the tray box 78 from which all of the electronic components 16 have been transferred to the mounting head 100 is moved further upwards from the component-supply position to a predetermined retracted position when the next tray box 78 is moved to the component-supply position, so that the required vertical space is provided between the component-supply position and the retracted position. The component-supplying device 22 of tray type is identical in construction with a component-supplying device disclosed in JP-B2-2-57719.

The mounting head 100 of the component-mounting device 18 is movable in the mutually perpendicular X-axis and Y-axis directions, so that the mounting head 100 can take a linear movement having X-axis and Y-axis components, to move each electronic component 16 to a desired position on or above the component-mounting surface 28 of the printed-wiring board 12. To move the mounting head 100 in the X-axis direction, the component-mounting device 18 includes two ballscrews 104 disposed on the machine base 10, on the opposite sides of the PWB conveyor 14, so as to extend in the X-axis direction, as shown in FIG. 1, and an X-axis slide 106 having two ballnuts 108 (only one of which is shown in FIG. 1) which engage the respective ballscrews 104. The component-mounting device 18 further includes two X-axis drive motors 110 for rotating the ballscrews 104, for moving the X-axis slide 106 in the X-axis direction.

As shown in FIG. 1, the X-axis slide 106 extends in the Y-axis direction across the PWB conveyor 14, and has a length corresponding to the distance between the component-supplying device 20 of feeder type and the component-supplying device 22 of tray type. On the machine base 10, there are disposed two guide rails 112 (shown in FIG. 3) located under the respective ballscrews 104. The X-axis slide 106 has two guide blocks 114 which slidably engage the guide rails 112, for guiding the X-axis slide 106 in the X-axis direction. It will be understood that the ballscrews 104, ballnuts 108 and X-axis drive motors 110 cooperate with each other to constitute an X-axis positioning device 116.

Figure 3:
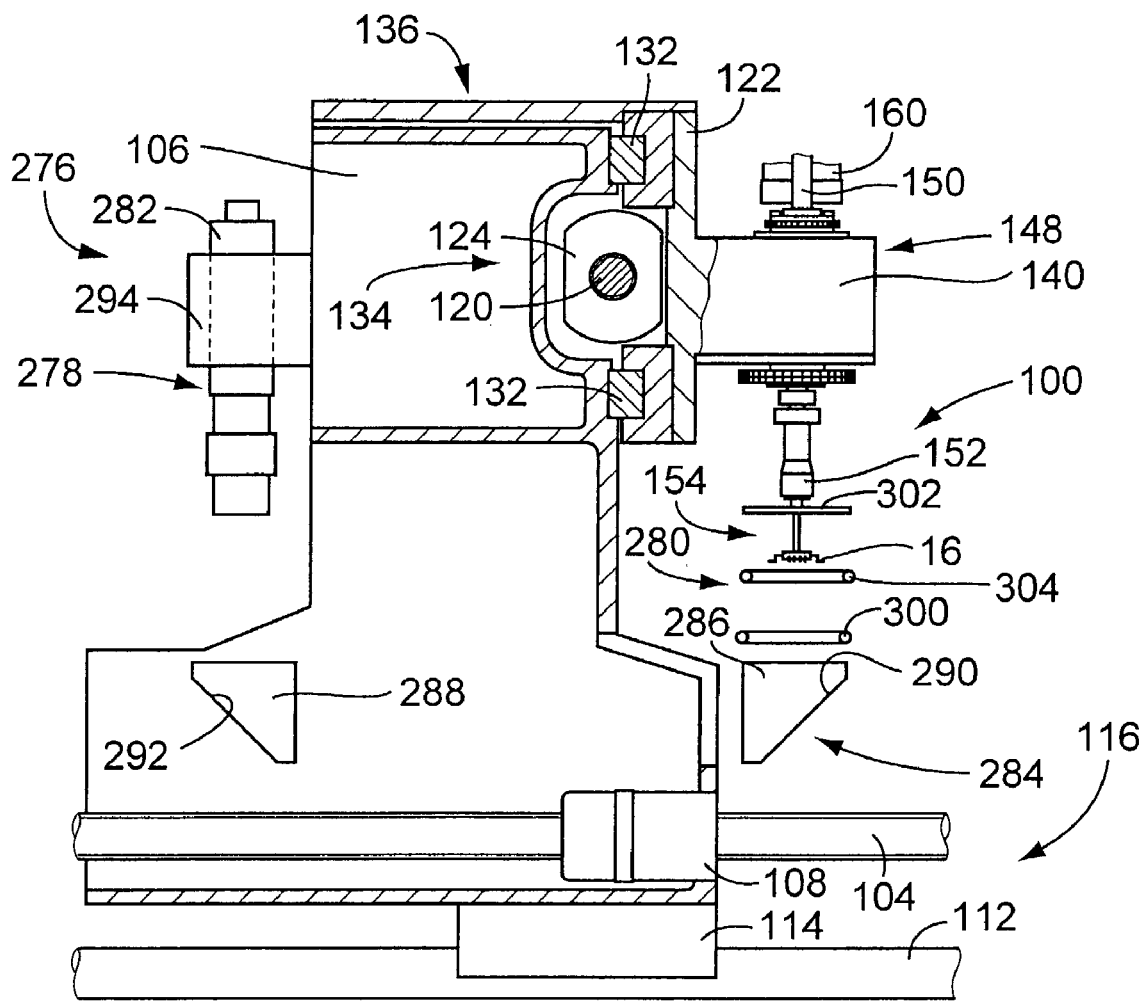
FIG. 3 is a front elevational view partly in cross section of the electric-component mounting system.

On the X-axis slide 106, there is disposed a ballscrew 120 so as to extend in the Y-axis direction, as shown in FIG. 3. The X-axis slide 106 carries a Y-axis slide 122 having a ballnut 124 which engages the ballscrew 120. The ballscrew 120 is rotated by a Y-axis drive motor 126 (shown in FIG. 1) through gears 128, 130, so that the Y-axis slide 122 is moved in the Y-axis direction while being guided by a pair of guide rails 132 (FIG. 3). It will be understood that the ballscrew 120, ballnut 124 and Y-axis drive motor 126 constitute a Y-axis positioning device 134, and that the Y-axis positioning device 134 cooperates with the X-axis slide 106, X-axis positioning device 116 and Y-axis slide 122, to constitute an XY robot 136 operable to move the mounting head 100 to a desired position in the XY plane.

The Y-axis slide 122 has a support portion 140 on which there are mounted the above-indicated mounting head 100, a head elevating and lowering device 144 for moving up and down the mounting head 100 in a Z-axis direction, and a head-rotating device 146 about its axis. The mounting head 100, the head elevating and lowering device 144 and the head-rotating device 146 constitute a component-mounting unit 148. Although the component-mounting device 18 in the present electronic-component mounting system 11 includes only one component-mounting unit, the system may include a plurality of component-mounting units. For instance, two or more component-mounting units are disposed on the Y-axis slide 122 such that the units are arranged in a row in the Y-axis direction.

The component-mounting unit 148 in the present system 10 is identical with a component-mounting unit as disclosed in JP-B2-4-3093339. The component-mounting unit 148 will be described only briefly. The support portion 140 of the Y-axis slide 122 carries a rotary shaft 150 which is movable in the Z-axis direction and rotatable about a vertical axis. The rotary shaft 150 has a nozzle holder 152 at its lower end portion. The nozzle holder 152 is provided to removably hold a component holder in the form of a suction nozzle 154. In the present system 11, the nozzle holder 152 and the rotary shaft 150 constitute the mounting head 100. The Z-axis direction is perpendicular to the X-axis and Y-axis directions which define the XY plane parallel to the horizontal component-mounting surface 28 of the printed-wiring board 12.

Figure 4:
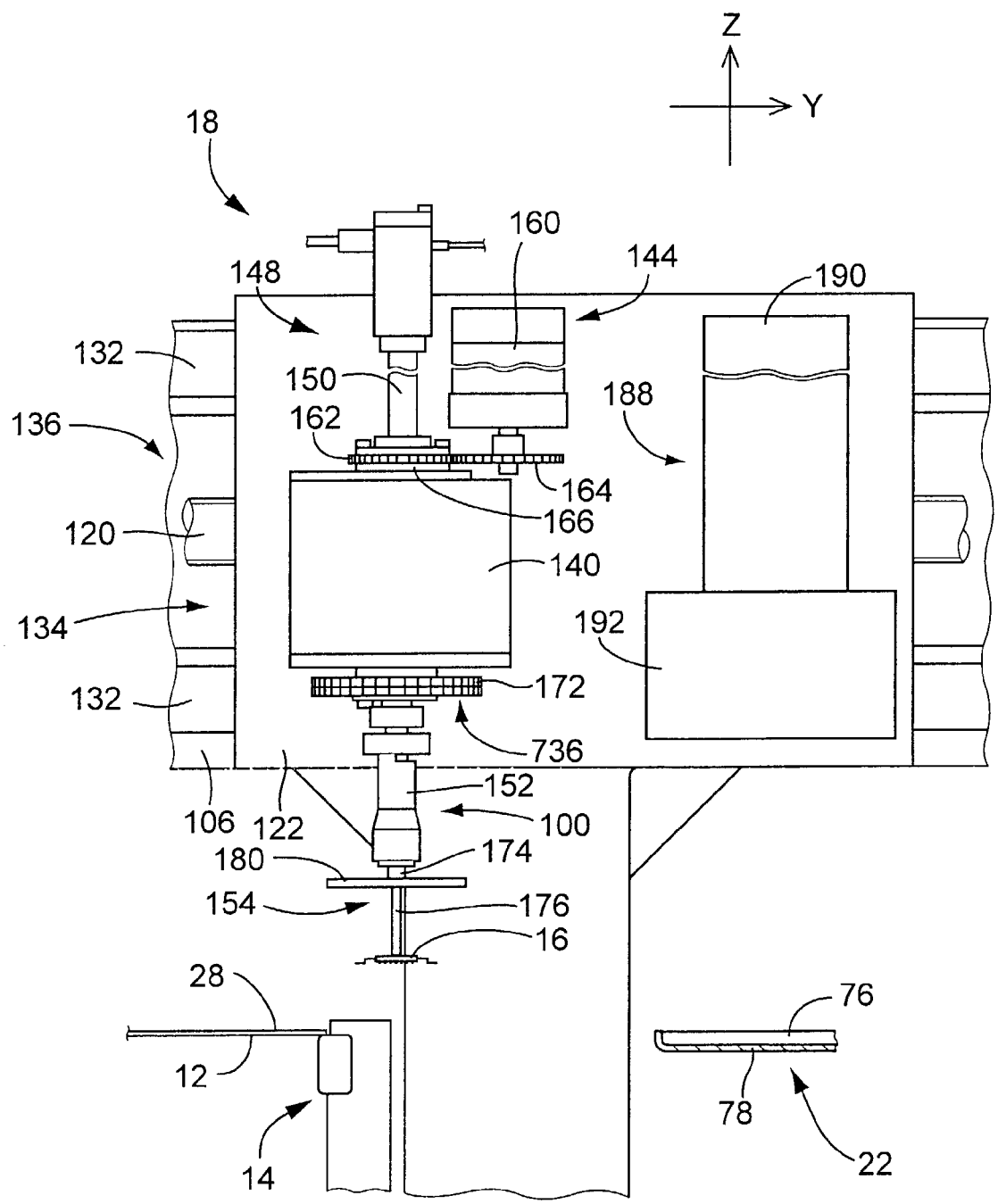
FIG. 4 is a side elevational view showing a component-mounting device of the electronic-component mounting system.

As shown in FIG. 4, the head elevating and lowering device 144 includes a vertical drive motor 160 as a drive source, a motion transmitting device including gears 162, 164, and a ballnut 166. A rotary motion of the vertical drive motor 160 is transmitted through the motion transmitting device to the ballnut 166, so that the rotary shaft 150 engaging the ballnut 166 is vertically moved to move the mounting head 100 in the Z-axis direction. The head-rotating device 146 includes a rotary drive motor 170 (shown in FIG. 7), and a motion transmitting device including a gear 172. A rotary motion of the rotary drive motor 170 is transmitted to the rotary shaft 150 through the motion transmitting device, so that the rotary shaft 150 is rotated about its axis to rotate the mounting head 100.

The suction nozzle 154 is arranged to hold the electronic component 16 by suction under a negative pressure, so that the electronic component 16 is transferred from the suction nozzle 154 onto the printed-wiring board 12. The suction nozzle 154 is connected to a negative-pressure source, a positive-pressure source and the atmosphere, which are not shown. With a switching operation of a solenoid-operated directional control valve (not shown), a suction tube 176 of the suction nozzle 154 is selectively communicated with the negative- and positive-pressure sources and the atmosphere.

As shown in FIG. 4, the Y-axis slide 122 carries a fiducial-mark imaging system 188 operable to take images of the fiducial marks provided on the printed-wiring board 12. The fiducial-mark imaging system 188 includes an imaging device in the form of a fiducial-mark camera 190 and an illuminating device 192. The fiducial-mark camera 190 is a two-dimensional monochromatic CCD camera which is capable of taking a two-dimensional image of an object at one time and which is provided with solid image sensors in the form of a matrix CCDs (charged-coupled devices), and a lens system including a focusing lens. The fiducial-mark camera 190 is fixed on the Y-axis slide 122 through a suitable bracket, such that the optical axis of the camera 190 extends in the vertical direction and such that the camera 190 faces downwards. The matrix of CCDs includes a matrix of a multiplicity of minute photosensitive elements which are arranged in one plane and which generate respective electric signals corresponding to the amounts of light incident thereupon. The multiple photosensitive elements cooperate to define an imaging screen 194 shown in FIG. 12.

Figure 5:
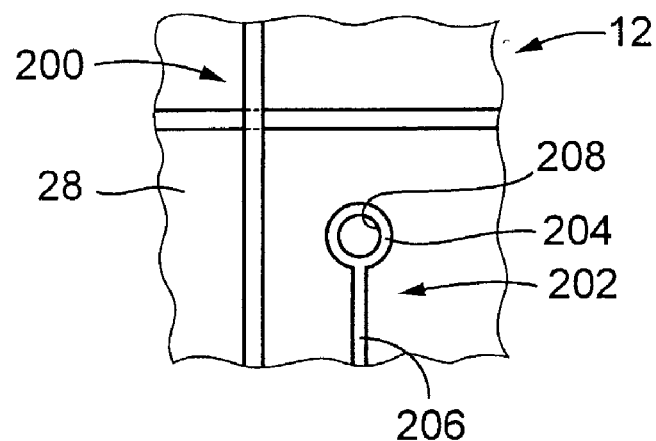
FIG. 5 is a plan view of a fiducial mark provided on a printed-wiring board on which electronic components are to be mounted in the electronic-component mounting system.
Figure 6:
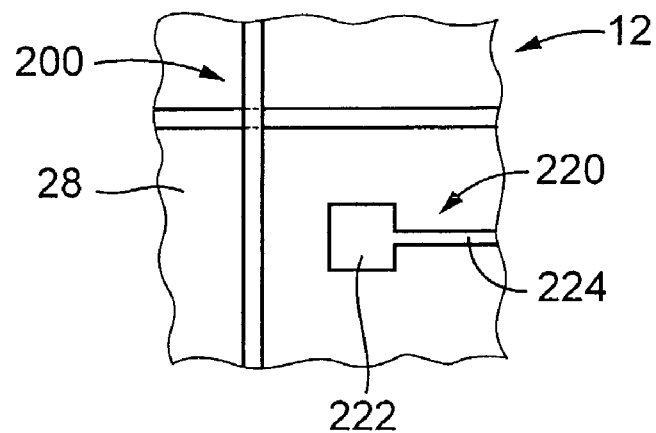
FIG. 6 is a plan view of another form of fiducial mark provided on the printed-wiring board.

In the present electronic-component mounting system 11, the printed-wiring board 12 is provided with fiducial marks in the form of land patterns formed on its component-mounting surface 28, on which a printed wiring pattern 200 is formed, as shown in FIGS. 5 and 6 by way of example. Two or more land patterns of different configurations are provided on the same printed-wiring board 12.

Each land pattern has a land to which a lead of the electronic component is connected. The geometry of the land is determined depending upon the state in which the electronic components are mounted on the board 12, and the configuration of the leads of the electronic components. Where the electronic components are insert-type components which are mounted on the upper component-mounting surface 18 of the printed-wiring board 12 such that the leads of the electronic components extend through through-holes formed through the thickness of the board 12, and soldered on the lower surface of the board 12, the board 12 is provided with a land pattern 202 which includes an annular land 204 having a central circular insert hole 208, as shown in FIG. 5 by way of example. A wiring segment 206 extends from the land 204.

The electronic component 16, which is illustrated as one form of the electronic component, has a plurality of leads extending from its side faces. These leads are soldered on the upper component-mounting surface 28. In this case, the printed-wiring board 12 is provided with a land pattern 220 which includes a rectangular land 222 from which a wiring segment 224 extends, as shown in FIG. 6 by way of example.

In the present embodiment, the printed-wiring board 12 is provided with two fiducial marks in the form of two lands formed on the upper component-mounting surface 28, at respective two positions which are spaced from each other along a diagonal straight line which passes two diagonally opposed corners of the rectangle of the board 12. Described more specifically, one of the two lands is the annular land 204 shown in FIG. 5, while the other land is the rectangular land 222 shown in FIG. 6. These two lands 204, 222 will be hereinafter referred to as the fiducial marks, where appropriate.

As shown in FIG. 1, the X-axis slide 106 is provided with two component-imaging systems 276, which are disposed at respective Y-axis positions at which the respective two ballscrews 106 are disposed. Namely, one of the two component-imaging systems 276 is located between the component-supplying device 20 of feeder type and the PWB conveyor 14 (printed-wiring board 12 placed thereon), while the other component-imaging system 276 is located between the component-supplying device 22 of tray type and the PWB conveyor 14. The two component-imaging system 276 are identical in construction with each other.

Each component-imaging system 276 includes an imaging device 278 and an illuminating device 280, as shown in FIG. 3. In the present electronic-component mounting system 11, the imaging device 278 includes a component camera 282 for taking an image of the electronic component 16, and a light guiding device 284, as shown in FIG. 3. The light guiding device 284 includes a reflecting device in the form of reflecting mirrors 286, 288, which are attached through respective brackets to the underside of the X-axis slide 106. The reflecting mirror 286 is disposed at a position within a path of movement of the mounting head 100 in the Y-axis direction, and ha a reflecting surface 290 which is inclined about 45° with respect to a vertical plane including the centerline of the suction nozzle 154, such that one of the opposite ends of the reflecting surface 290 (as viewed in the X-axis direction) which is closer to the X-axis slide 1-6 is the lower end, that is, the left end of the reflecting surface 290 is the lower end.

The other reflecting mirror 288 is disposed on the side of the X-axis slide 106 which is remote from the reflecting mirror 286, and has a reflecting surface 292 which is inclined with respect to the vertical plane, symmetrically with the reflecting surface 290. The component camera 282 for taking the image of the electronic component 16 held by the suction nozzle 154 is located on the side of the X-axis slide 106 remote from the mounting head 100, such that the component camera 282 faces downwards toward the reflecting surface 292 of the reflecting mirror 288.

In the above arrangement of the component-imaging system 276, the image of the electronic component 16 held by the suction nozzle 715 can be taken by the component camera 282 when the mounting head 100 is moved by the XY robot 136 to the Y-axis position of the corresponding ballscrew 104 at which the electric component 16 is located right above the reflecting mirror 286. Thus, the component-imaging system 276 is arranged to image the electronic component 16 located at the predetermined image-taking position which lies within a path of movement of the electronic component 16 when the Y-axis slide 122 is moved in the Y-axis direction relative to the X-axis slide 106. In the present system 11, the component camera 282 is a two-dimensional CCD camera, like the fiducial-mark camera 190 described above.

A strobe light 300 as a UV irradiating device is disposed near the reflecting mirror 286, for irradiating a light-emitting plate 302 of the suction nozzle 154 with a ultraviolet radiation. The light-emitting plate 302 absorbs the ultraviolet radiation, and emits a visible light for illuminating the bottom surface of the electronic component 16. The component camera 282 takes a silhouette image of the electronic component 16 in the axial direction of the suction nozzle 154, with the light-emitting plate 302 used as a background light.

Another strobe light 304 for emitting a visible light is disposed nearer to the suction nozzle 154 than the above-indicated strobe light 300. This strobe light 304 serves as a visible-light irradiating device for illuminating the bottom surface of the electronic component 106 with a visible light, for taking a normal image of the electronic component 16 rather than a silhouette image. The light-emitting plate 302, UV irradiating device 300 and visible-light irradiating device 304 cooperate to constitute the illuminating device 280 or a light source device.

Figure 7:
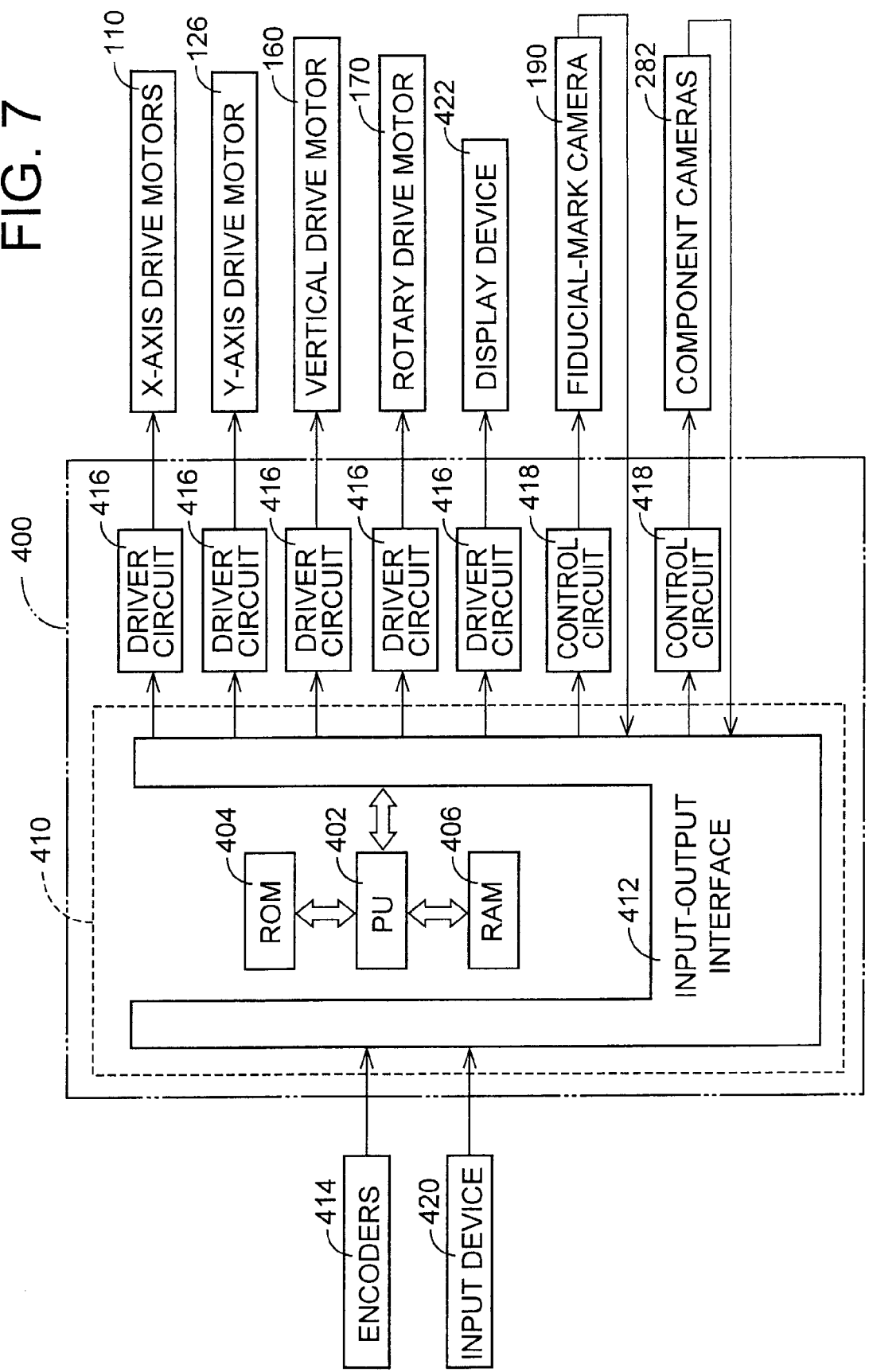
FIG. 7 is a block diagram illustrating of a control device and some other elements of the electronic-component mounting system which relate to the present invention.

The present electronic-component mounting system 11 includes a control device 400 illustrated in the block diagram of FIG. 7. It is noted that FIG. 7 also shows some other elements of the system 11 which relate to the present invention. The control device 400 is constituted principally by a computer 410 incorporating a processing unit (PU) 402, a read-only memory (ROM) 404, a random-access memory (RAM) 406, and a bus interconnecting those elements. To the bus, there is connected an input-output interface 412 to which are connected encoders 414 and other sensors, and an input device 420 which has alphabetic keys, numeral keys, and various function keys.

To the input-output interface 412, there are also connected through driver circuits 416 the X-axis drive motors 110, Y-axis drive motor 126, vertical drive motor 160, rotary drive motor 170, and a display device 422. Each of the motors 110, 126, 160, 180 serving as a drive source is a servomotor in the present embodiment. However, a stepping motor may be used in place of the servomotor. The operating amount or angular position of each of the motors 110, 126, 160, 180 is detected by an angular position detecting device in the form of an encoder 414, an output signal of which is used to control the motor. The display device 422 has a display screen.

Figure 8:
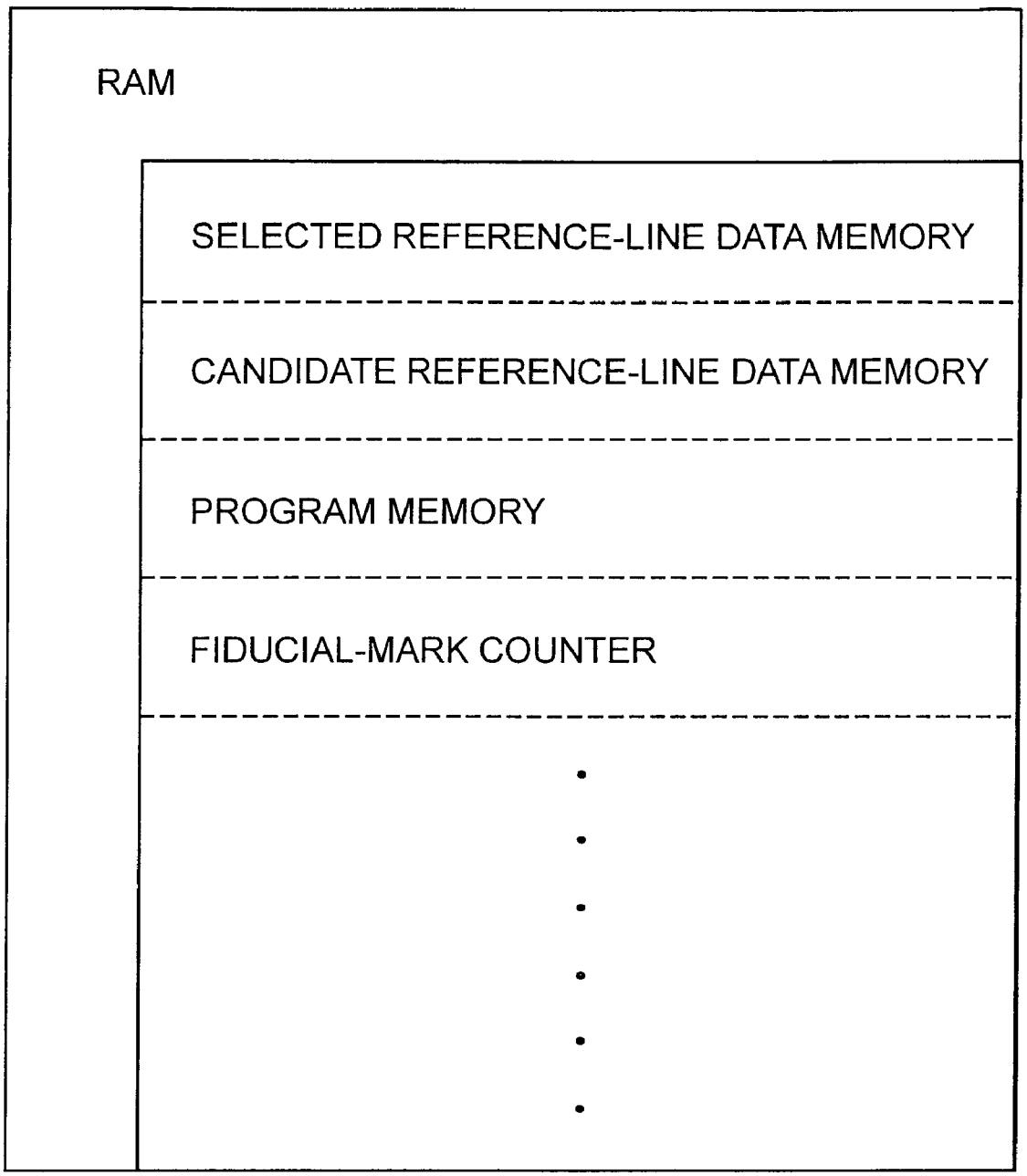
FIG. 8 is a block diagram illustrating an arrangement of a RAM of a computer which is a principal part of the control device.

To the input-output interface 412, there are further connected through control circuits 418 the fiducial-mark camera 190 and the component camera 282 of the two component-imaging systems 276. The driver circuits 416, control circuits 418 and computer 410 constitute the control device 400. The RAM 406 includes a selected reference-line data memory, a candidate reference-line data memory, a program memory, and a fiducial-mark counter, as well as a working memory, as shown in FIG. 8. The program memory of the RAM 406 stores various control programs and data, such as a program for executing a main control routine (not shown), a program for executing a reference-line setting routine illustrated in the flow chart of FIG. 9, a program for executing a position-error detecting routine illustrated in the flow chart of FIG. 10, and a program for executing a component-mounting routine for mounting the electronic components 16 on the printed-wiring board 12.

There will be described an operation of the electronic-component mounting system 11. When the electronic components 16 are mounted on the printed-wiring board 12, the board 12 is transferred by the PWB conveyor 14 onto the PWB holding device 15, and held by the PWB holding device 15. Before the operation to mount the electronic components 16 on the board 12, the images of the fiducial marks 204, 222 are taken by the fiducial-mark camera 190, to detect the hold-position errors of the board 12 as held by the PWB holding device 15, and the positioning errors of the component-mounting spots on the component-mounting surface 28, at which the electronic components 16 are to be mounted.

When the fiducial marks 204, 222 are imaged by the fiducial-mark camera 190, not only the images of the fiducial marks 204, 222 but also the images of the areas surrounding the fiducial-marks 204, 222 are taken by the fiducial-mark camera 190. For example, the fiducial-mark camera 190 takes not only the images of the fiducial marks 204, 222, but also the images of wiring segments 206, 224 of the land patterns 202, 220, and portions of the wiring pattern 200 which are located adjacent to the land patterns 202, 220. Therefore, it is necessary to search the imaging screen 194 of the fiducial-mark camera 190, to find out the images of the fiducial marks 204, 222, from among the images formed within the imaging screen 194. This search for the images of the fiducial marks 204, 222 is effected using at least one reference line which is set for each of the fiducial marks 204, 222 and which is sufficient to identify each fiducial mark.

Figure 9:
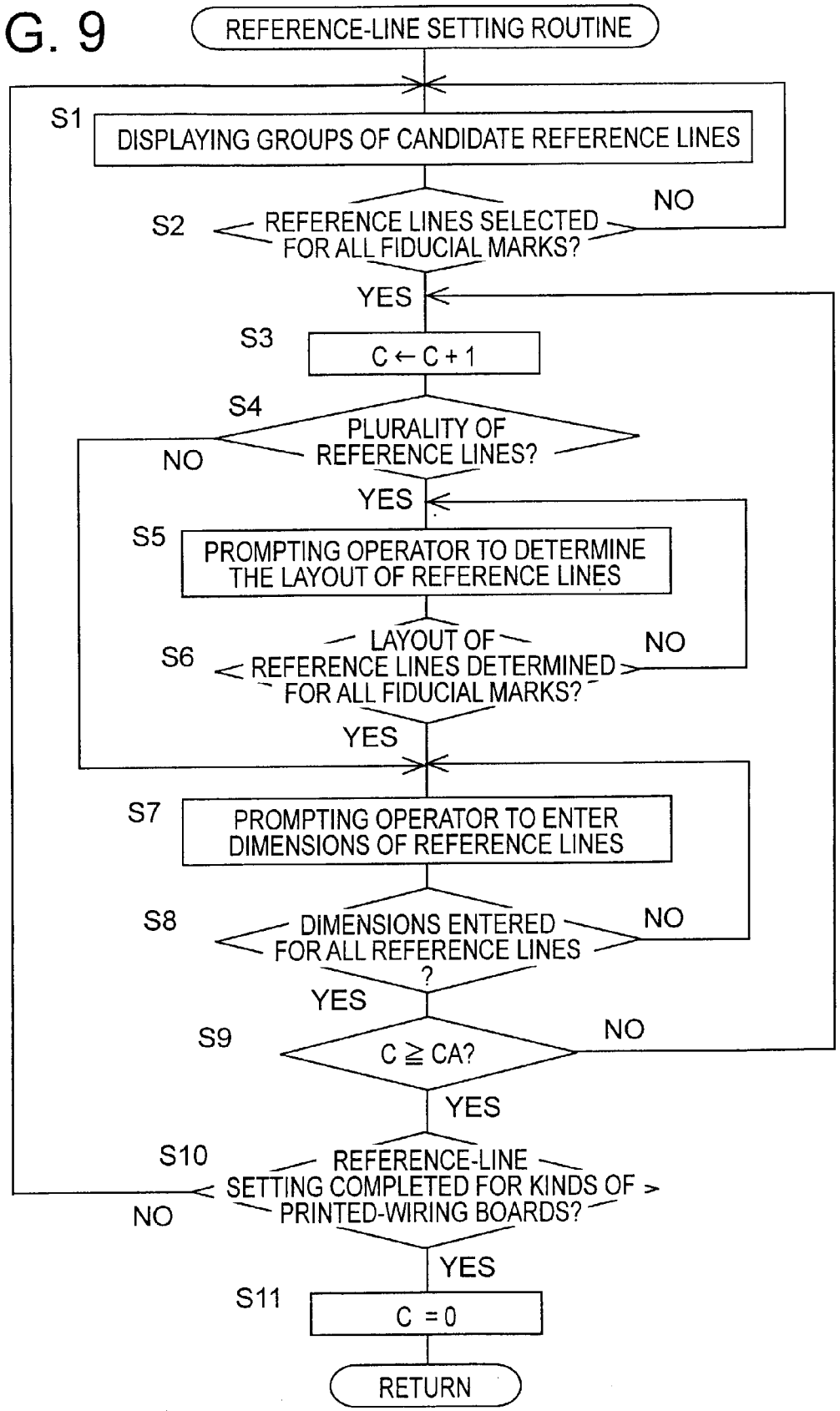
FIG. 9 is a flow chart illustrating a reference-line setting routine executed according to a program stored in the RAM of the computer.

Referring next to the flow chart of FIG. 9, the reference-line setting routine will be described. This routine is initiated with step S1 in which the display device 422 is commanded to display on its screen all of a plurality of groups of candidate reference lines stored in the candidate reference-line data memory of the RAM 406. The candidate lines have various shapes such as straight lines, and curved lines which may be closed or open, and combinations of those lines. In the specific example of FIG. 11, the two-dimensional candidate reference-line data memory of the RAM 406 stores reference-line data indicative of candidate reference lines in the form of a simple straight segment, a circle, an L-shaped straight line, a polygon (e.g., a square, a rectangle or a triangle), a circular arc, and a bent straight line.

On the display screen of the display device 422, there are displayed the reference lines, and a message prompting the operator to enter or specify the specific kind or type of the printed-wiring board 12 in question. In response to this prompting message, the operator manipulates the input device 420 to enter the kind of the board 12. As a result, the display device 422 displays a wiring diagram which indicates the printed-wiring pattern and the land patterns and which are represented by stored designing data. The wiring diagram is generated by a CAD system incorporated in the computer 410. The display screen also provides a message prompting the operator to specify the lands to be used as the fiducial marks, and select the reference lines for the specified lands.

The operator observing the circuit diagram indicated on the display screen of the display device 522 specifies the lands to be used as the fiducial marks, and selects the corresponding reference lines from among the candidate reference lines displayed on the display screen. Where the operator initially specifies the annular land 204 shown in FIG. 11, as the land to be used as one fiducial mark, the operator usually selects the circle as one two-dimensional reference line from among the displayed two-dimensional candidate reference lines, since the annular land 204 has a substantially circular profile. The selection of the circle as the reference line is implemented through the input device 420. Data indicative of the selected reference line are stored in the selected reference-line data memory, in relation to data indicative of the kind of the printed-wiring board 12 provided with the fiducial mark 204, and position data indicative of the position of the fiducial mark 204 which are obtained on the basis of the circuit diagram data. The manner of selecting the reference lines is determined depending upon the kinds of the reference lines. For instance, the kind of each reference line to be selected and the number of the reference lines are specified. Where the reference line is a polygon, the number of apexes of the polygon is specified. Where the reference line is a circular arc, the center angle of the circular arc is specified directly by the operator, or specified indirectly by selecting one of a plurality of circular arcs which have respective predetermined different center angles. Where the reference line is a bent straight line, the number of bends is specified.

Then, the operator specifies the next land to be used as another fiducial mark, and selects the corresponding reference line or lines. For example, the operator specifies the rectangular land 222 shown in FIG. 11 as the second fiducial mark, and selects, for this land 222, an incomplete rectangle each of four sides of which is locally or partly cut out. In this case, the operator specifies four two-dimensional L-shaped reference lines that cooperate to define the incomplete rectangle. That is, any rectangle can be defined by a group of four L-shaped straight lines. The rectangular land or fiducial mark 222 is specified by a group of four L-shaped reference lines. Data indicative of the selected two-dimensional reference lines are stored in the selected reference-line data memory, in relation to the data indicative of the kind of the printed-wiring board 12 in question, and the position data indicative of the position of the fiducial mark 222. Thus, each of the two fiducial marks 204, 222 is defined by at least one reference line selected by the operator.

Step S1 is followed by step S2 to determine whether the reference lines have been specified or selected for all of the fiducial marks. That is, steps S1 and S2 are repeatedly implemented until the reference lines have been specified for all of the fiducial marks. When the reference lines for all the fiducial marks have been specified, an affirmative decision is obtained in step S2, and the control flow goes to step S3 and the following steps to determine the layout of the specified reference lines of each fiducial mark, where the fiducial mark is specified by two or more reference lines. The operations to determine the layouts of the references line of the two or more fiducial marks are performed in the order in which the fiducial marks have been specified. Step S3 is implemented to increment a count C of a fiducial-mark counter provided to count the number of the fiducial marks set for the printed-wiring board 12. The count C of this counter, which is provided in the RAM 406, as shown in FIG. 8, is reset to "0" upon initialization of the computer 410 in the main control routine. When step S3 is implemented for the first time, the count C is incremented to "1", so that step S4 to determine the layout of the reference lines is implemented for the first fiducial mark 204.

Step S4 is implemented to determine whether the first fiducial mark 204 is specified by a plurality of reference lines that should be positioned relative to each other. In the case of the first fiducial mark 204 specified by a single reference line (i.e., circle), a negative decision (NO) is obtained in step S4, and the control flow goes directly to step S7 while skipping steps S5 and S6. In step S7, the display screen of the display device 422 provides a message prompting the operator to specify dimensions of the selected reference lines. Each of the reference lines has a predetermined dimension or dimensions that should be specified.

The display screen provides a message prompting the operator to enter the specific value of each dimension of the reference line. In response to this message, the operator points the fiducial mark 204 in the circuit diagram displayed on the display screen, so that the diameter of the annular land 204 as defined by the stored designing data is indicated on the display screen. The operator enters the indicated diameter as the dimension of the selected reference line (circle), so that the data indicative of the entered diameter of the annular land 204 are stored in the selected reference-line data memory of the RAM 406, together with the selected reference line data. The diameter of the fiducial mark 204 may be automatically stored in the selected reference-line data memory, as the dimension of the selected reference line, when the fiducial mark 204 in the circuit diagram displayed on the display screen is pointed by the operator.

Then, step S8 is implemented to determine whether the dimensions have been entered for all of the selected reference lines. Steps S7 and S8 are repeatedly implemented until the dimensions have been entered for all of the selected reference lines. When an affirmative decision (YES) is obtained in step S8 as a result of entry of the dimensions of all of the selected reference lines, the control flow goes to step S9 to determine whether the count C of the counter in the RAM 406 has been incremented to a predetermined value CA, which is equal to the number of the fiducial marks provided on the printed-wiring board 12. This predetermined value CA is obtained from the number of the reference marks whose data are stored in the selected reference-line data memory. When the dimension of only the circle selected as the reference line for the first fiducial mark 204 has been entered, a negative decision (NO) is obtained in step S9, and the control flow goes back to step S3 to further increment the count C, and repeat the following steps S4–S7 to determine the layout of the references lines for the second fiducial mark 222 and enter the dimensions of these reference lines.

Since the four L-shaped straight lines have been selected as the reference lines for the second rectangular reference mark 222, the affirmative decision (YES) is obtained in step S4, and the control flow goes to step S5 in which the operator determines the layout of the four reference lines, on the basis of the circuit diagram of the printed-wiring board 12 as displayed on the display screen of the display device 422. The layouts of respective groups of reference lines for the respective fiducial marks are determined depending upon the kinds of the groups of reference lines. In the case of the four L-shaped straight lines for the rectangular fiducial mark or land 222, a point of bend of each L-shaped straight line must be specified. When the operator points the land 222 in the circuit diagram displayed on the display screen, the display screen displays a coordinate system in which the four apexes of the rectangular land 222 are defined. The operator enters positional data indicative of the position of the point of bend of each of the four L-shaped reference lines for the rectangular land 222. The coordinate values of the four apexes of the rectangular land 222 may be automatically stored in the selected reference-line data memory, as the positions of the four L-shaped reference lines, when the land 222 in the circuit diagram displayed on the display screen is pointed by the operator. In the case of the four L-shaped reference lines, the operator is further required to indicate whether the two arms of each of the four L-shaped reference lines are open in the inward direction or outward direction with respect to a center of a rectangle defined by the reference lines. In the present case, the two arms are open in the inward direction. Data indicative of the layout of the four reference lines (positions of the four points of bend and the inward or outward direction of opening of the two arms) are stored in the selected reference-line data memory, together with the selected reference line data.

Step S5 is followed by step S6 to determine whether the layout of all of the selected reference lines has been determined. Steps S5 and S6 are repeatedly implemented until step S5 has been implemented for all of the reference lines. When the operator keys in a signal indicating that the layout is completed, an affirmative decision (YES) is obtained in step S7 in which the operator enters the dimensions of the four L-shaped reference lines, more precisely, the length of each arm of the L-shaped reference lines. Namely, the four L-shaped reference lines have the same dimension, and the two arms of each L-shaped reference line have the same length. When the operator points the fiducial mark 222 in the circuit diagram displayed on the display screen, the display screen indicates the length of each side of the fiducial mark 222 in the form of a square, and the width of the wiring segment 224 which extends from the square fiducial mark 222. The operator observing the displayed fiducial mark 222 calculates the length of each arm, which is a half of a difference obtained by subtracting the width of the wiring segment 224 from the length of each side of the square of the fiducial mark 222. The operator enters the calculated length of each arm. These operations are repeated for all of the four L-shaped reference lines. Dimension data thus entered are stored in the selected reference-line data memory, together with the selected reference line data and the layout data. The length of each arm of the L-shaped reference lines may be automatically calculated on the basis of the length of each side of the reference mark 222 and the width of the wiring segment 224, and stored in the selected reference-line data memory.

When the entry of the dimensions of the L-shaped reference lines is completed, the operator keys in a signal indicating that the entry is completed. As a result, an affirmative decision (YES) is obtained in step S8, and the control flow goes to step S9 to increment the count C to "2". Since the predetermined value CA is equal to "2" in this specific example wherein the two fiducial marks 204, 222 are provided on the printed-wiring board 12, an affirmative decision (YES) is obtained in step S9, and the control flow goes to step S10 to determine whether the reference lines have been set for all of the fiducial marks for all of different kinds of printed-wiring boards 12. In step S10, the display screen provides a message prompting the operator to key in a signal indicating the completion of the setting of the reference lines for all kinds of printed-wiring boards 12. If the electronic components 16 are to be mounted on only one kind of printed-wiring board 12, the operator keys in the signal. If the electronic components 16 are to be mounted on two or more different kinds of printed-wiring boards 12, the operator keys in a signal indicating that the setting of the reference lines is repeated for the other kinds of printed-wiring board 12. In the latter case, a negative decision (NO) is obtained in step S10, and the control flow goes back to step S1. In the present example wherein the reference lines are set for only one kind of printed-wiring board 12, the operator keys in the signal indicating that the setting of the reference lines is completed, so that an affirmative decision (YES) is obtained in step S10, and step S11 is implemented to reset the count C of the counter to "0". Thus, the reference-line setting routine of FIG. 9 is terminated.

Referring next to the flow chart of FIG. 10, there will be described the position-error detecting routine executed to detect the positioning errors of the plurality of component-mounting spots on the printed-wiring board 12.

Figure 10:
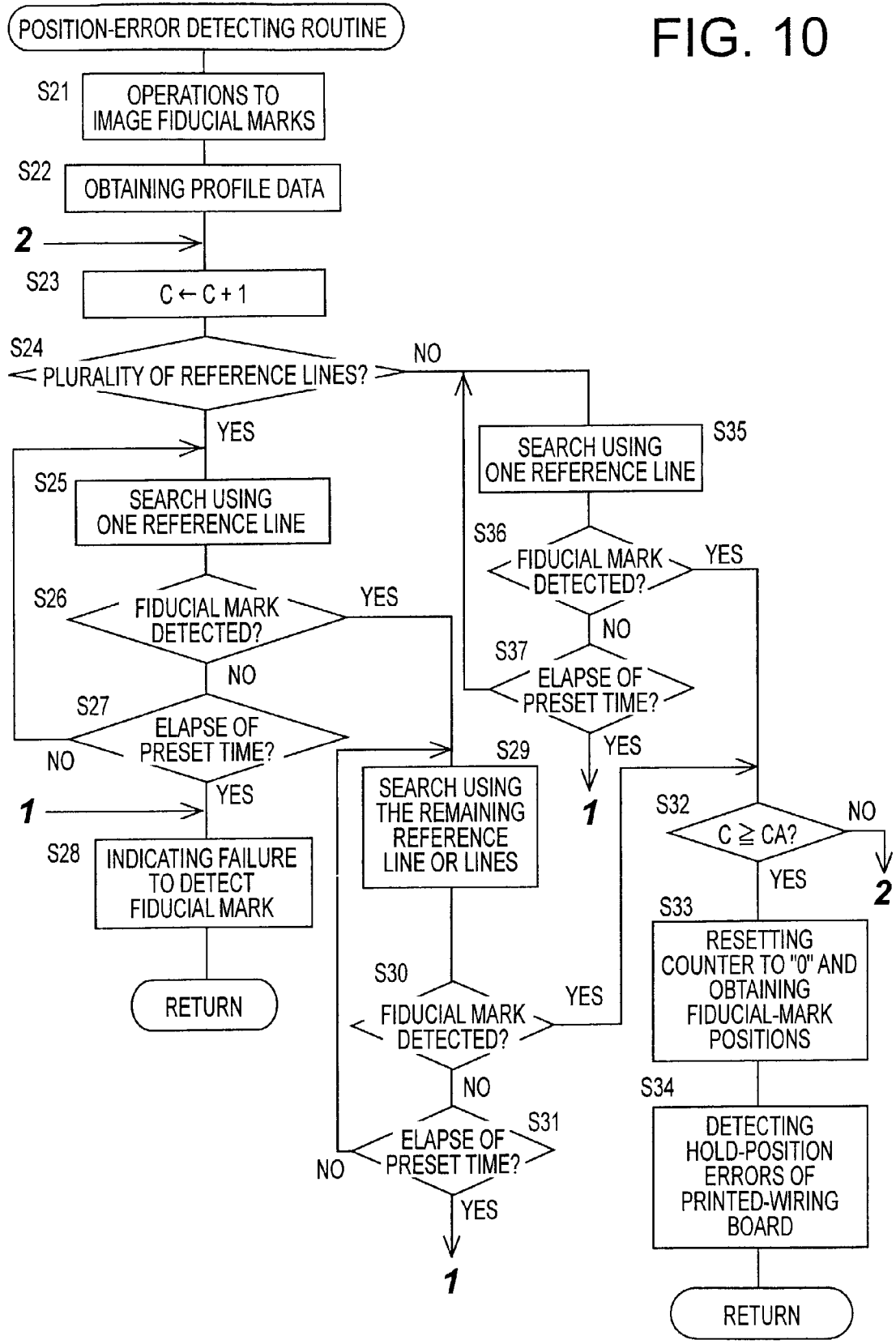
FIG. 10 is a flow chart illustrating a position-error detecting routine executed according to a program also stored in the RAM of the computer.
Figure 12:
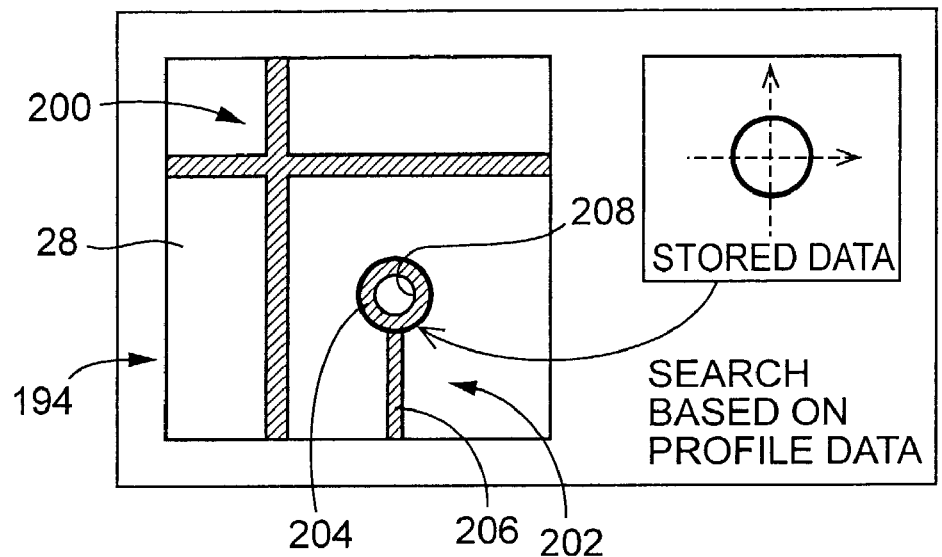
FIG. 12 is a view for explaining a manner of searching for the fiducial mark shown in FIG. 5.
Figure 13:
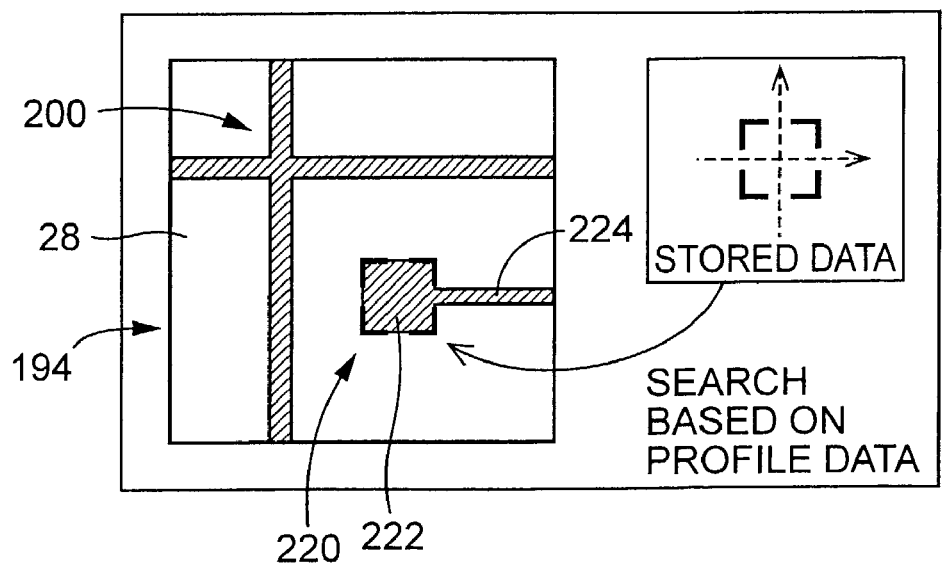
FIG. 13 is a view for explaining a manner of searching for the fiducial mark shown in FIG. 6.

The position-error detecting routine of FIG. 10 is initiated with step S21 in which the images of the fiducial marks 204, 222 are taken by the fiducial-mark camera 190. Described more specifically, the fiducial-mark camera 190 is moved by the XY robot 136, according to predetermined movement data, to respective positions for taking the images of the fiducial marks 204, 222. The movement data are determined by the positions of the fiducial marks 204, 222 whose data are stored in the selected reference-line data memory, together with the selected reference-line data, in the reference-line setting routine of FIG. 9. In the present example, two images respectively shown in FIGS. 12 and 13 are taken by the fiducial-mark camera 190 at the above-indicated positions. It is noted that the fiducial marks 204, 222, wiring pattern 200 and wiring segments 206, 224 are indicated by hatching lines.

When the images of the fiducial marks 204, 222 have been taken in step S22, image data indicative of the images are processed to obtain profile data indicative of the profiles or edges of the images. The profiles are defined by respective groups of points at which the optical characteristic such as the brightness of the images changes at an extremely high rate in the direction parallel to the plane of the imaging screen 194. In the present example, the component-mounting surface 28 of the printed-wiring board 12, and the wiring pattern 200 and land patterns 202, 220 have different optical characteristics, more specifically, different values of brightness, since the surface 28 has a comparatively dark color (e.g., green) while the wiring pattern 200 and land patterns 202, 220 formed of an electrically conductive material have comparatively light colors. Accordingly, the brightness of the images suddenly changes at boundaries between the surface 28 and the wiring pattern 200 and land patterns 202, 220, so that the profiles of those patterns 200, 202, 220 can be determined on the basis of the brightness values of the adjacent picture elements of the imaging screen 194, or on the basis of the rate of change of the brightness value. In the former case, the points defining the profile can be detected on the basis of differences of the brightness values of the adjacent picture elements as compared with a threshold value. In the latter case, the points can be detected on the basis of the rate of change of the brightness value as compared with a threshold value. Since the manner of determining the profiles of the images is known and its understanding not necessary to understand the present invention, no further description in this respect is deemed necessary.

Then, the control flow goes to step S23 and the following steps to search for the fiducial marks 204, 222 on the basis of the profile data and the reference-line data. In the present example wherein two sets of image data corresponding to the two fiducial marks have been obtained, these two fiducial marks are searched for, one after the other, for instance, in the order in which the image data sets have been obtained. To this end, step S23 is implemented to increment the count C of the fiducial-mark counter provided in the RAM 406 to count the number of the fiducial marks. The fiducial-mark counter has been reset to "0" in step S11 of the reference-line setting routine of FIG. 9. When step S23 is implemented for the first time, the count C is incremented to "1" so that the first fiducial mark 204 which was imaged first is searched for. A fact that the first fiducial mark 204 was imaged first can be confirmed on the basis of the position of the first fiducial mark 204 and the path of movement of the fiducial-mark camera 190 which was taken in step S21.

Step S23 is followed by step S24 to determine whether a plurality of reference lines were set for the first fiducial mark 204. In this example wherein the single reference line (circle) was set for the fiducial mark or land 204, a negative decision (NO) is obtained in step S24, and the control flow goes to step S35 in which the data indicative of the reference line set for the first fiducial mark 204 and the data indicative of the dimension of this reference line are read out from the selected reference-line data memory, and a search for the fiducial mark 204 is effected on the basis of those data and the profile data obtained in step S22. This search is effected depending upon whether more than the profiles represented by the profile data includes a profile which substantially matches or coincides with the reference line set for the fiducial mark 204. This determination is made depending upon whether the amount of positional deviation of each profile with respect to the position of the reference line is smaller than a predetermined allowable upper limit. The substantial matching or coincidence of the profile with the reference line is interpreted to mean that more than a predetermined percentage of the profile matches the reference line. Searches in steps S25 and S29 which will be described are effected in the same manner as described above with respect to step S35.

In step S35, the profiles of the images obtained in step S22 are sequentially examined to check whether more than the predetermined percentage of any profile matches the reference line. Since the manner of this checking is known and its understanding is not necessary to understand the present invention, no further description in this respect is deemed necessary. In the case of the fiducial mark 204 from which the wiring segment 206 extends in the radially outward direction, the actual profile is not a complete circumference corresponding to the selected reference line in the form of a circle. In this respect, the above-indicated predetermined percentage of matching of the profile of the reference mark 204 with respect to the reference line is determined to be 95%. This percentage is specified by the operator upon selection of the reference lines, and stored in the selected reference-line data memory, together with the reference-line data, etc.

Step S35 is followed by step S36 to determine whether the profiles represented by the profile data include a profile more than the predetermined percentage of which matches the reference line. Usually, a negative decision (NO) is obtained in step S36 when this step is implemented for the first time. In this case, the control flow goes to step S37 to determine whether a predetermined time has passed after the initiation of the search for the fiducial mark 204 in step S35. This predetermined time may be held constant, or may be changed depending upon the specific kind of the reference line in question. Further, the predetermined time may be changed depending upon the specific manner of effecting the search, or the specific manner of defining the reference line. For instance, the predetermined time may be determined to be relatively long where the reference line is defined by a comparatively large number of points, and relatively short where the reference line is defined by a comparatively small number of points. Where the predetermined time is changed depending upon the kind of the reference line, the overall time required to complete the search can be shortened for the reference lines which are comparatively short in length or simple in configuration.

If the fiducial mark 204 has been detected before the predetermined time has passed, that if any profile more than the predetermined percentage of which matches the selected reference line has been detected before the predetermined time has passed, an affirmative decision (YES) is obtained in step S36, and the control flow goes to step S32. If the predetermined time has passed without finding any profile which substantially matches the reference line, an affirmative decision (YES) is obtained in step S37, and the control flow goes to step S28 in which the display device 422 provides an indication of a failure to detect the fiducial mark 204. In this case, the position-error detecting routine is terminated. The affirmative decision (YES) is obtained in step S37 in any one of the following cases: where the predetermined time has passed before the search has been completed for all of the profiles; where the search completed before the predetermined time has passed indicates that the profiles represented by the profile data includes two or more profiles which substantially matches the reference line; where the search completed before the predetermined time has passed indicates that the profiles do not include any profile which substantially matches the reference line. In step S28, the display device 422 also provides an indication of a cause for the failure to detect the fiducial mark in question. Thus, the display device 422 functions as an indicator device which provides a visual indication of the failure to detect the fiducial mark. Another indicator device of audio, optical or any other type may be provided to provide an indication of the failure, in addition to the visual indication provided by the display device 422.

Thus, the position-error detecting routine is terminated where the predetermined time has passed, that is, where it is impossible to detect the fiducial mark in question. This arrangement prevents a search for an excessively long time and an accordingly long delay in the operator's setup operation, due to repeated searching operations which would be performed for respective multiple profiles. Although the search may be repeated for all of a large number of profiles, it takes a long time, and it is better to terminate the search and try to eliminate a possible cause for the long time of search. The position-error detecting routine is terminated also where the search indicates that the profiles include a plurality of profiles which substantially coincide with or match the reference line, or do not include any profile which substantially matches the reference line.

The operator observing the indication provided on the display device 422 in step S28 may try to eliminate the possible cause for the failure to detect the fiducial mark in question. The failure to detect the fiducial mark may take place where the number of the profiles is too large to complete the search for these profiles within the predetermined time. This may be caused due to any abnormality of the fiducial-mark camera 190, for instance, due to damaging of the lens of the fiducial-mark camera 190, which may result in formation of images. In this respect, the operator is required to inspect the fiducial-mark camera 190 for any abnormality. Where the profiles represented by the obtained profile data include two or more profiles substantially matching the reference line or do not include any profile substantially matching the reference line, possible causes for this abnormality include: an error in the manufacture of the printed-wiring board 12; a failure of the PWB holding device 15 to correctly hold the printed-wiring board 12; a failure of the stopper device (not shown) to locate the board 12 at the predetermined component-mounting position, at the end of an operation of the PWB conveyor 14 to transfer the board 12; and an abnormality of the XY robot 136 operated to move the fiducial-mark camera 190 in step S21. The operator is required to inspect the printed-wiring board 12, XY robot 136 and other related devices, for finding out the cause for the failure to detect the fiducial mark.

When the search indicates, before the predetermined time has passed, that the profiles includes one profile which substantially matches the reference line, this profile is considered to define the image of the fiducial mark 204, and an affirmative decision (YES) is obtained in step S36, and the control flow goes to step S32 to determine whether the count C has incremented to the predetermined value CA, that is, whether the search has been effected for all of the fiducial marks provided on the printed-wiring board 12. Where the search is completed for only the fiducial mark 204, but not for the fiducial mark 222, a negative decision (NO) is obtained in step S33, and the control flow goes back to step S23 and the following steps.

In step S23, the count C is implemented to "2", so that the search is effected for the second fiducial mark 222. Step S23 is followed by step S24 to determine whether a plurality of reference lines were set for the second fiducial mark 222. Since the four L-shaped reference lines were set for the fiducial mark 222, an affirmative decision (YES) is obtained in step S24, and the control flow goes to step S25 in which a search for the fiducial mark 222 is effected using a selected one of the four L-shaped reference lines, to determine whether the profiles represented by the profile data obtained in step S22 include a profile more than a predetermined percentage of which matches the selected one reference line. However, a search for the fiducial mark 222 may be effected using all of the four S--shaped reference lines. In this case, steps S29–S31 are eliminated.

Figure 11:
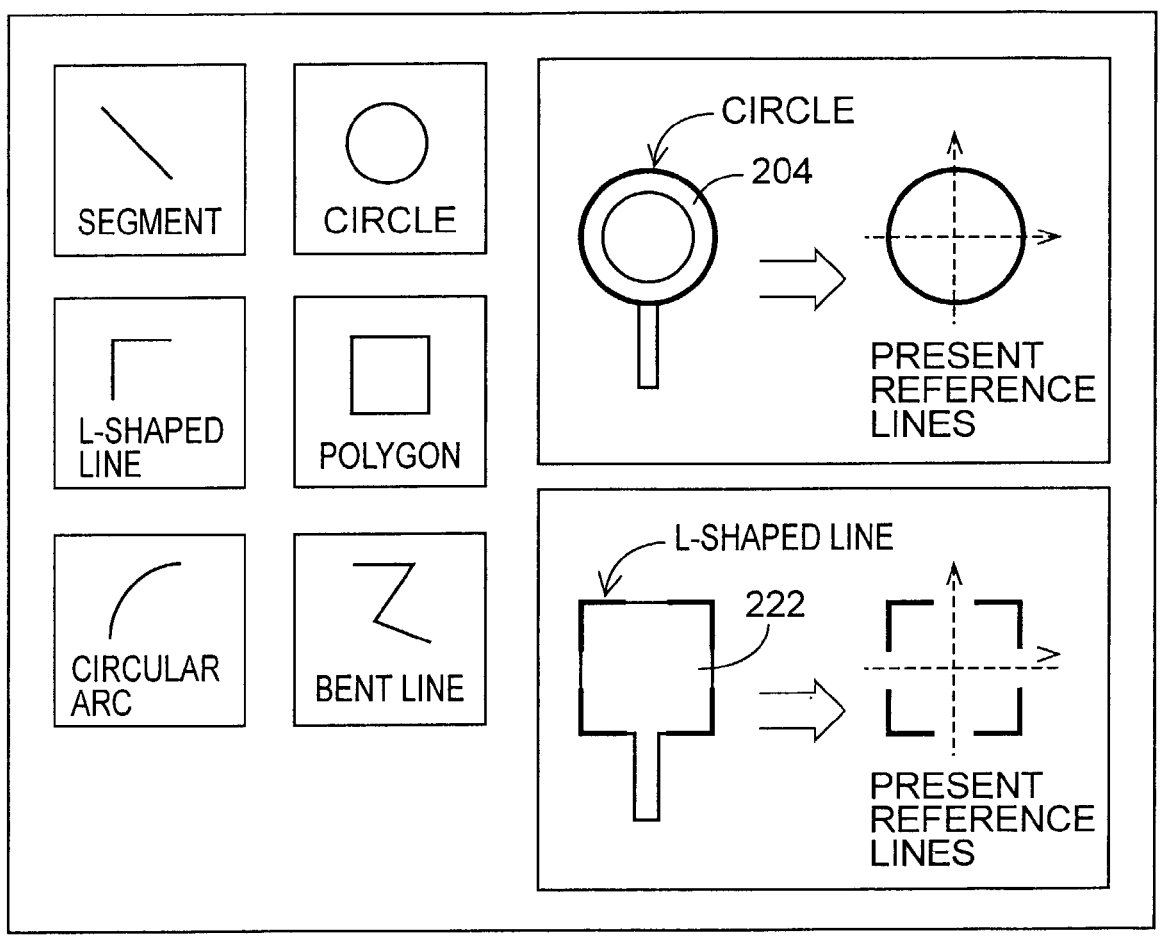
FIG. 11 is a view for explaining a manner of setting reference lines for searching for the two fiducial marks respectively shown in FIGS. 5 and 6.

In the present example, step S25 is formulated to select one of the L-shaped reference line whose X and Y coordinate values are the smallest. At this time, the data indicative of the direction of opening of the two arms of the selected L-shaped reference line and the data indicative of the dimension of the selected reference line are read out from the selected reference-line data memory of the RAM 406. All of the profiles obtained in step S22 are searched to determine whether these profiles include a profile which substantially matches the selected L-shaped reference line. The predetermined percentage used to effect this determination is determined to be 99% for the L-shaped reference lines. As indicated in FIG. 11, the fiducial mark 222 is an incomplete square each of four sides of which is partly or locally cut out, and from which the wiring segment 224 extends, as shown in FIG. 13. This incomplete square is defined by the four L-shaped reference lines each consisting of the two arms whose length specified in step S7 does not include the dimension of the cutout or width of the wiring segment 224. In this respect, the predetermined percentage is determined to be 99% for each L-shaped reference line.

Step S25 is followed by step S26 to determine whether the fiducial mark 222 has been detected, more precisely, whether at least one of the profiles searched in step S25 includes a profile segment more than the predetermined percentage (99%) of which matches the selected one L-shaped reference line. This profile segment to be detected in step S25 defines a part of the actual profile of the fiducial mark 222. When step S26 is implemented for the first time, a negative decision (NO) is usually obtained in step S26, and the control flow goes to step S27 to determine whether a predetermined time has passed after the moment of initiation of the search in step S25. When step S27 is implemented for the first time, a negative decision (NO) is usually obtained also in this step S27, and the control flow goes back to step S25. The predetermined time used in step S27 is determined in the same manner as described above with respect to step S37.

If the search completed before expiration of the predetermined time for all of the profiles obtained by the fiducial camera 190 at the position corresponding to the fiducial mark 222 indicates that at least one of the profiles includes a profile segment which substantially matches the selected L-shaped reference line, an affirmative decision (YES) is obtained in step S26, and the control flow goes to step S29 in which a search is effected using the remaining three L-shaped reference lines.

In step S29, the profile including the profile segment detected in step S25 (each of at least one profile including the detected profile segment) is checked so as to determine whether the profile further includes three profile segments which substantially match the respective three L-shaped reference lines other than the one selected in step S25. This determination is effected on the basis of the layout data (positions and direction of opening of the two arms) of the four L-shaped reference lines stored in step S5, and a predetermined percentage value of matching or coincidence of the profile segments with the respective the three reference lines.

Step S29 is followed by step S30 to determine whether the profile including the profile segment detected in step S25 includes three profile segments which substantially match the respective three L-shaped reference lines. When step S30 is implemented for the first time, a negative decision (NO) is obtained in this step, and the control flow goes to step S31 to determine whether a predetermined time has passed. This predetermined time may be the same as or shorter than the predetermined time used in step S27 (permissible upper limit of the search time in step S25).

If the search in step S29 indicates, before expiration of the predetermined time, that the profile including the profile segment substantially matching the first L-shaped reference line further includes three profile segments which substantially match the respective three other L-shaped reference lines, an affirmative decision (YES) is obtained in step S30, namely, the profile including the profile segments substantially matching the four L-shaped reference lines is determined as the profile of the fiducial mark 222. In this case, the control flow goes to step S32 to determine whether the count C has been incremented to "2". Since the number of the fiducial marks 204, 222 provided on the printed-wiring board 12 is equal to "2", an affirmative decision (YES) is now obtained in step S32, and the control flow goes to step S33 in which the count C is reset to "0", and the positions of the fiducial marks 204, 222 are obtained on the basis of the profiles of the images of these marks 204, 222 determined in steps S35 and S29. The position of the center of the annular fiducial mark 204 is obtained as the position of the fiducial mark 204, while the position of the center of the square fiducial mark 222 is obtained as the position of the fiducial mark 222. Then, the control flow goes to step S34 to obtain positioning errors of the two fiducial marks 204, 222 in the X-axis and Y-axis directions, and obtain the hold-position errors of the printed-wiring board 12 and the positioning errors $\Delta XP$ and $\Delta YP$ of the component-mountings spots on the board 12, on the basis of the obtained positioning errors of the fiducial marks 204, 222.

If the predetermined time has passed after the initiation of the search in step S25, without finding any profile including a profile segment which substantially matches the selected one L-shaped reference line, an affirmative decision (YES) is obtained in step S28, and the control flow goes to step S28 in which the display device 422 provides an indication of a failure to detect the fiducial mark 222. The affirmative decision (YES) is obtained in step S28 where the predetermined time has passed before the search has been completed for all of the profiles, or where the search completed before the predetermined time has passed indicates that the profiles do not include any profile which substantially matches with the selected L-shaped reference line. If the predetermined time has passed after the initiation of the search in step S29, without finding any profile including four profile segments which substantially matches the respective four L-shaped reference lines, an affirmative decision (YES) is obtained in step S31, and the control flow goes to step S28 in which the display device 422 provides an indication of a failure to detect the fiducial mark 222. The affirmative decision (YES) is obtained in step S31 in any one of the following cases: where the predetermined time has passed before the search has been completed for all of the three remaining L-shaped reference lines; where the search completed before the predetermined time has passed indicates that the profile including the profile segment substantially matching the selected one L-shaped reference line does not further include profile segments which substantially matches with the other three L-shaped reference lines, respectively; and where the search completed before the predetermined time has passed indicates that the profile including the profile segment substantially matching the selected one L-shaped reference line include a plurality of profile segments which substantially match any one of the other three L-shaped reference lines.

When the electronic component 16 is mounted on the printed-wiring board 12, the mounting head 100 is moved to the component-supply position of the component-supplying device 20 of tape feeder type or component-supplying device 22 of tray type, by movements of the X-axis slide 106 and the Y-axis slide 122. Further, the mounting head 100 is vertically moved by the head elevating and lowering device 144, to permit the suction nozzle 154 to hold the electronic component 16 by suction under the negative pressure. The following description refers to a component mounting operation where the mounting head 100 receives the electronic component 16 from the component-supplying device 20 of tape feeder type.

The mounting head 100 with its suction nozzle 154 holding the electronic component 16 is moved from the component-receiving position to a predetermined component-mounting spot on the printed-wiring board 12 on which the electronic component 16 is mounted. At the component-receiving position, the mounting head 100 receives the electronic component 16 from an appropriate one of the tape feeders 70. During the movement of the mounting head 100 from the component-receiving position to the component-mounting spot, the mounting head 100 is necessarily moved over the reflecting mirror 286 which is fixed to a portion of the X-axis slide 106 which is located between the component-receiving position and the component-mounting spot. In other words, the mounting head 100 necessarily passes across the reflecting mirror 286 between the component-supplying device 20 and the board 12, in the Y-axis direction, while the mounting head 100 is moved from the component-supplying position to the component-mounting spot. Accordingly, an image of the electronic component 16 can be taken by the component camera 282. A position at which the component camera 282 takes the image of the electronic component 16 while the mounting head 100 is located right above the reflecting mirror 286 will be referred to as "a component-hold-position detecting position" or "an image-taking position".

Where the angular position of the electronic component 16 in which the electronic component 16 is mounted on the board 12 is different from the angular position in which the electronic component 16 is held by the suction nozzle 154, the mounting head 100 is rotated about its axis by the head-turning device 146, to rotate the electronic component 16 to its mounting angular position, while the mounting head 100 is moved from the component-receiving position to the component-hold-position detecting position.

When the mounting head 100 has reached the component-hold-position detecting position, the image of the electronic component 16 is taken by the component camera 282. Since the imaging device 278 is disposed on the X-axis slide 106, the image of the electronic component 16 is taken while the mounting head 100 is moved in the X-axis direction and while the movement of the mounting head 100 in the Y-axis direction is interrupted.

The control device 400 compare actual image data indicative of the image of the electronic component 16 with reference image data indicative of a nominal image of the electronic component 16 which does not have any errors of positioning on the suction nozzle 154. As a result of comparison of the actual image data with the reference image data, the control device 400 calculates horizontal positioning errors $\Delta XE$ and $\Delta YE$ and an angular positioning error $\Delta\theta$ of the electronic component 16.

Horizontal positioning errors $\Delta XP$ and $\Delta YP$ of the printed-wiring board 12 are calculated on the basis of images of the fiducial-marks 204 provided on the board 12, which have been taken by the fiducial-mark camera 190. During the movement of the mounting head 100 to the component-mounting spot on the board 12, movement data representative of the distances of movements of the mounting head 100 to the component-mounting spot on the board 12 in the X-axis and Y-axis directions are adjusted for compensation for the horizontal positioning errors $\Delta XP$ and $\Delta YP$ of the board 12, the horizontal positioning errors $\Delta XE$ and $\Delta YE$ of the center of the electronic component 16, and center position errors due to compensation for the angular positioning error $\Delta\theta$ of the electronic component 16. Further, the mounting head 100 is rotated by the head-turning device 146, for compensation for the angular positioning error $\Delta\theta$ of the electronic component 16. These compensations permit the electronic component 16 to be mounted exactly at the predetermined mounting spot, in the desired attitude. When the electronic component 16 is mounted on the board 12, the mounting head 100 is moved to the component-mounting spot in the XY plane and lowered to its mounting position. During these movements of the mounting head 100, the above-indicated positioning errors are calculated by the control device 400. Thus, one cycle of operation to mount one electronic component 16 on the printed-wiring board 12 is completed.

It will be understood from the foregoing description of the present embodiment of the invention that the selected reference-line data memory of the RAM 406 constitutes a reference-line data storing portion, while the candidate reference-line data memory of the RAM 406 constitutes a candidate-reference-line data storing portion. It will also be understood that a portion of the control device 400 assigned to implement step S22 constitutes a profile-data obtaining portion, while a portion of the control device 400 assigned to implement steps S25, S29 and S35 constitutes a searching portion, which cooperates with the profile-data obtaining portion to constitute an image-data processing device. It will further be understood that a portion of the control device 400 assigned to implement steps S33 constitutes a fiducial-mark-position obtaining portion, while a portion of the control device 400 assigned to implement step S34 constitutes a position-error obtaining portion operable to obtain positioning errors of the fiducial marks 204, 222, the printed-wiring board 12 and the component-mounting spots on the component-mounting surface 28. It will also be understood that a portion of the control device 400 assigned to implement steps S1–S7 constitutes a reference-line setting portion, while the input device 420 and the display device 422 may be considered to constitute a part of the reference-line setting portion.

Figure 14:
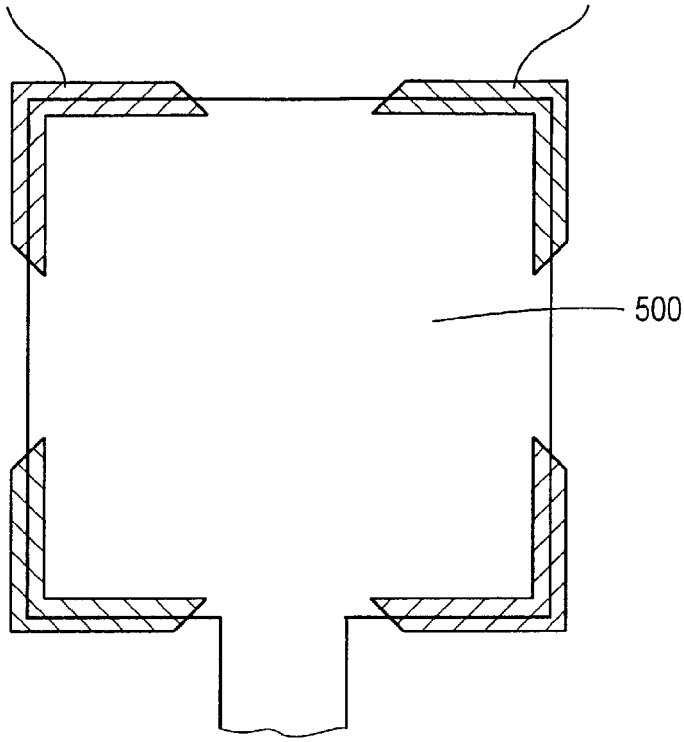
FIG. 14 is a view for explaining a manner of searching for a fiducial mark, according to another embodiment of this invention.

The search for the fiducial marks may be effected on the basis of reference regions which are defined by displacing respective reference lines in the inward and outward directions such that the displaced reference lines are moved toward and away from each other. An example of this search according to a second embodiment of this invention will be described by reference to FIGS. 14 and 15.

The present second embodiment uses a fiducial mark 500 having a square outer profile each side of which is locally or partially cut out. This square outer profile may be defined by a group of reference lines consisting of four L-shaped reference lines whose layout and dimensions are specified by the operator.

Figure 15:
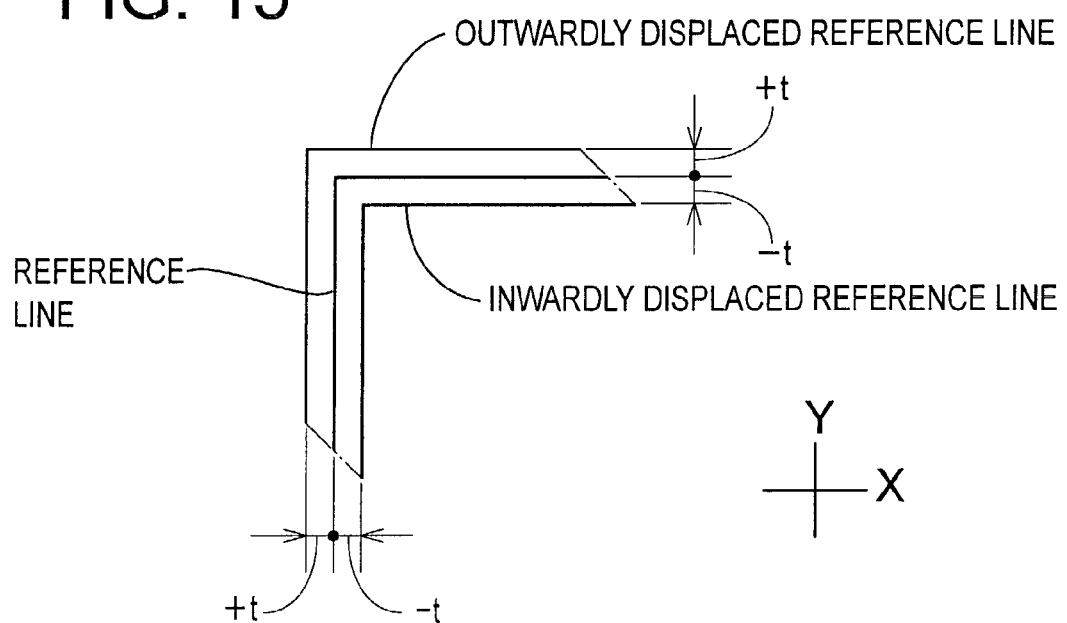
FIG. 15 is a view for explaining a manner of enlarging and contracting the reference lines in the fiducial-mark searching method of FIG. 14.

When a search for the fiducial mark 500 is effected, the fiducial-mark is imaged by the fiducial-mark camera 190, as in the first embodiment, and the thus obtained image data are processed to obtain-profile data of the images. Four L-shaped reference lines matching the respective four corners of the square outer profile of the fiducial mark 500 are specified by the operator. The obtained profile data are searched so as to check whether the profiles represented by the profile data include an outer profile which includes four profile segments that lie in respective four permissible reference regions (shown in FIG. 14), which are respectively defined by displacing the above-indicated four L-shaped reference lines in the inward and outward directions by a predetermined distance "t" in the X-axis and Y-axis directions, as indicated in FIG. 15 wherein "+t" represents the distance of displacement in the outward directions along the X and Y axes, while "−t" represents the same distance of displacement in the inward directions along the X and Y axes. The distance of displacement "t" determines a permissible amount of deviation of the outer profile of the profile data of the fiducial mark 500 with respect to the reference lines. In the present embodiment, the permissible amount "+t" of deviation in the outward direction is equal to the permissible amount "−t" of deviation in the inward direction. This permissible amount "t" of deviation in the inward and outward directions is entered by the operator through the input device 420, when the L-shaped reference lines are specified by the operator. The permissible amount of deviation (distance of displacement of the reference line) "−t" in the inward direction and the permissible amount of deviation (distance of displacement of the reference line) "+t" in the outward direction may be different from each other. The permissible amounts of inward and outward deviations which determine the above-indicated permissible reference regions may be represented by ratios of enlargement and contraction of the nominal outer profile of the fiducial mark 500 as defined by the four L-shaped reference lines.

The four permissible reference regions (indicated by hatching lines in FIG. 14) obtained by displacing the four L-shaped reference lines in the inward and outward directions are successively moved relative to the profiles represented by the profile data, to scan these profiles, for finding out one of the profiles which includes four profile segments respectively lying in the respective four permissible reference regions. If the profile including these four profile segments is found within a predetermined time, this profile is determined to be the outer profile of the fiducial mark 500. As in the first embodiment, the search is first effected to find out the profile which includes a profile segment lying in a selected one of the four permissible reference regions, and then the search is effected to determine whether this profile also includes three profile segments which lie in the respective three other permissible reference regions.

Figure 16:
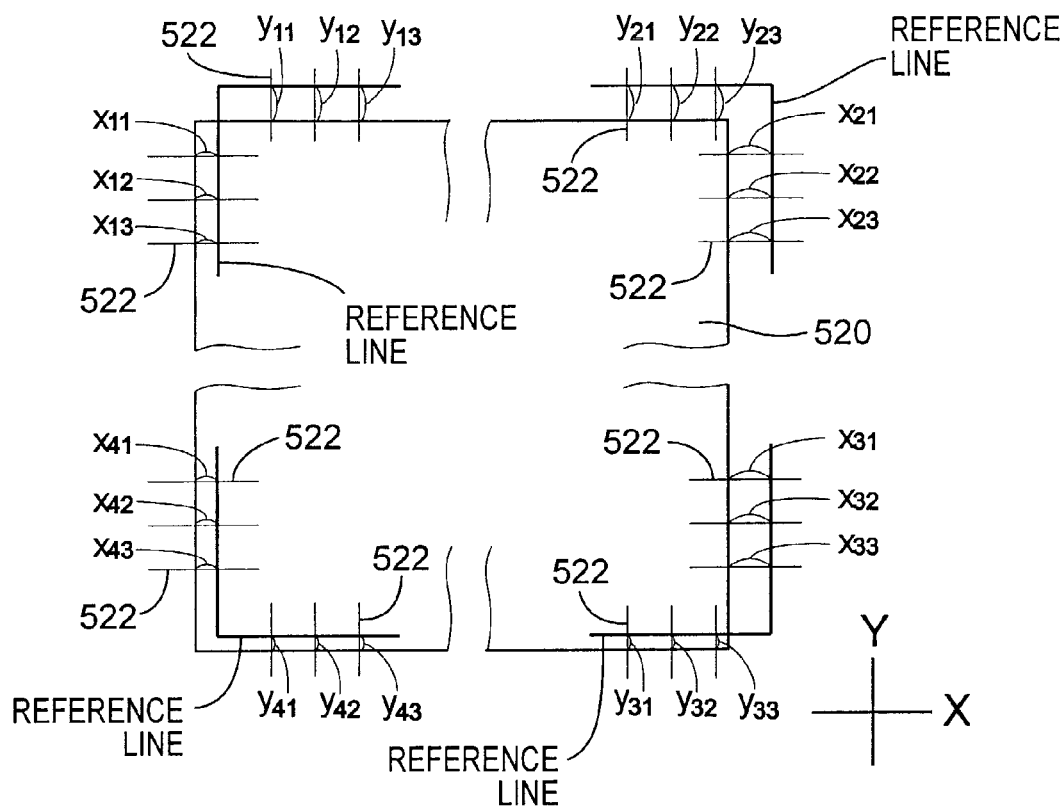
FIG. 16 is a view for explaining a manner of searching for a fiducial mark, according to a further embodiment of this invention.

As indicated above, the distance of displacement of the reference lines in the inward direction (ratio of enlargement of the nominal profile of the fiducial mark 500) may be different from that in the outward direction (ratio of contraction of the nominal profile). Further, at least one of the distances of displacements in the inward and outward directions (at least one of the enlargement and contraction ratios) in the X-axis direction may be different from that or those in the Y-axis direction.

Where a search is effected to determine whether an amount of deviation of a profile represented by the profile data with respect to the reference lines is held within a permissible range, seek lines as well as the reference lines may be used, as in a third embodiment of this invention illustrated in FIG. 16. A profile data search per se using seek lines is known as disclosed in JP-A-8-180191, for example.

The third embodiment also uses a fiducial mark 520 having a square outer profile each side of which is locally or partially cut out. This square outer profile may be defined by a group of reference lines consisting of four L-shaped reference lines whose layout and dimensions are specified by the operator. The layout of the four reference lines for the fiducial mark 520 is predetermined. Namely, the four L-shaped reference lines match the four corners of the square outer profile of the fiducial mark 520. After the profile data are obtained by imaging the fiducial mark 520 and the surrounding area, the profiles represented by the profile data are searched using a predetermined number of seek lines 522 set for each of the eight arms of the four L-shaped reference lines, as shown in FIG. 16.

In the present example wherein the two arms of each L-shaped reference lines are parallel to the X-axis and Y-axis directions, respectively, the seek lines 522 are perpendicular to the arms parallel to the X-axis and Y-axis directions. Described in detail, the X-axis seek lines 522 which are parallel to the X-axis direction are spaced from each other in the Y-axis direction such that the two X-axis seek lines 522 perpendicular to the two arms spaced apart from each other in the X-axis direction are located at the same position in the Y-axis direction. On the other hand, the Y-axis seek lines 522 which are parallel to the Y-axis direction are spaced from each other in the X-axis direction such that the two Y-axis seek lines 522 perpendicular to the two arms spaced apart from each other in the Y-axis direction are located at the same position in the X-axis direction.

When the search for the fiducial mark 520 is effected, the four L-shaped reference lines are moved with the seek lines 522 relative to the profiles represented by the obtained profile data, to scan these profiles. During this movement, the control device 400 obtains distances x11, x12, etc., x21, x22, etc., x31, x32, etc. and x41, x42, etc., and y11, y12, etc., y21, y22, etc., y31, y32, etc. and y41, y42, etc. between the reference lines and the profiles as measured along the seek lines 522. Then, the control device 400 calculates absolute values of sums |x11+x21| ... |x43+x33| of the two distances between each pair of two X-axis seek lines 522 having the same Y-axis coordinate value, and sums of absolute values

|y11+x41| ... |y23+y33| of the two distances between each pair of two Y-axis seek lines 522 having the same X-axis coordinate value.

If all of the absolute values of the above-indicated sums calculated in the X-axis and Y-axis directions for a given profile are not larger than a predetermined threshold "t", this profile is determined as the outer profile of the fiducial mark 520. The threshold "t" is two times a permissible distance of deviation of the profile with respect to the reference lines. In the specific example of FIG. 16, the profile represented by the profile data deviates from the reference lines in the X-axis and Y-axis directions. However, if all of the absolute values of the sums calculated for this profile are not larger than the predetermined threshold or upper limit "t", this profile may be considered to be the outer profile of the fiducial mark 520, since the profile may be made substantially coincident with the L-shaped reference lines by further moving the reference lines toward the profile. In the present embodiment, the upper limit "t" is entered by the operator through the input device 420 when the L-shaped reference lines are selected or specified. It is noted that the number of the seek lines 522 shown in FIG. 16 is made smaller than number of the seek lines 522 actually set for the reference lines, for simplification of the drawing for easier understanding.

The first embodiment of FIGS. 1–13 may be considered to use an extremely small permissible amount of deviation or upper limit "t" for effecting a search for the fiducial marks.

The search for the fiducial marks may be effected depending upon whether an area defined by each profile represented by the profile data is substantially entirely superimposed on a reference area defined by reference lines.

Figure 17:
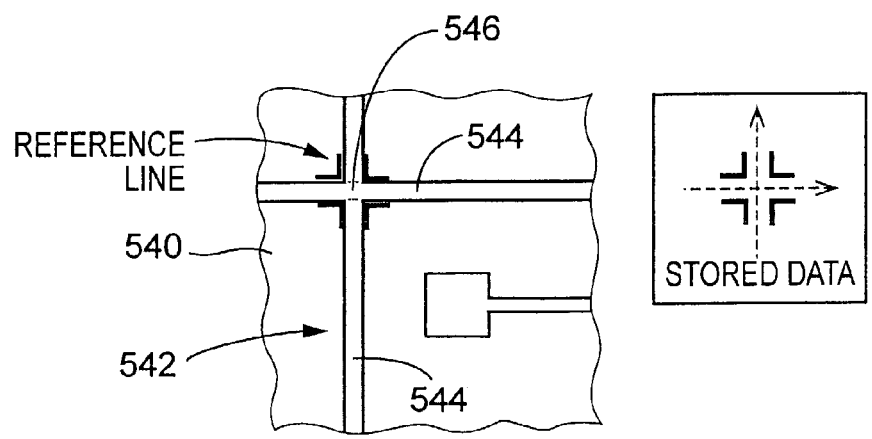
FIG. 17 is a view for explaining a manner of setting reference lines for searching for a fiducial mark, according to a still further embodiment of the present invention.

Various reference lines may be used to specify the fiducial marks, depending upon the configuration or geometry of each fiducial mark. In a third embodiment of the invention of FIG. 17, a printed-wiring board 540 is provided with a wiring pattern 542 including two wiring segments 544 which intersect each other at right angles and which provide a fiducial mark 546 in the form of a cross. In this case, the operator selects four L-shaped reference lines, and specifies the layout and dimensions of these four reference lines. The layout of the four L-shaped reference lines is such that the two arms of each reference line are open in the outward direction with respect to a center of the crisscross fiducial mark 546.

A fiducial mark may be defined or specified by reference lines of two or more different kinds.

The annular fiducial mark 202 or other annular fiducial mark having an outer profile which is locally or partly cut out may be specifies by at least one circular arc, for example, by a plurality of circular arcs of 120° (⅓ of the entire circumference of a circle), or a single circular arc of 270° (¾ of the entire circumference). The use of the circular arc or arcs permits a higher degree of accuracy in the determination of matching or coincidence of a profile represented by the profile data with the reference line or lines, than the use of a circle. Where a plurality of circular arcs are used as reference lines, a search is first effected to find a profile including a profile segment which substantially matches a selected one of the circular arcs, and then a search is effected to determine whether this profile further includes a profile segment or segments which substantially matches/match the other circular arc or arcs, as in the first and second embodiments wherein a plurality of L-shaped reference lines are used to specify the square fiducial mark 222.

In the illustrated embodiments, a search for the fiducial marks depends upon a result of a determination as to whether more than a predetermined percentage of a profile represented by the profile data, or more than a predetermined percentage of a segment of the profile, matches the corresponding reference line. However, the search may be effected depending upon a result of a determination as to whether less than a predetermined percentage of the profile or its segment does not match the corresponding reference line.

When the positions and dimensions of the reference lines for a fiducial mark are set by the operator, the position and dimensions of this fiducial mark formed on the printed-wiring board may be actually measured by the operator. In this case, it is desirable to measure the positions and dimensions of the same fiducial marks on the different printed-wiring boards of the same kind, and use average values of the measured positions and dimensions.

In the illustrated first embodiment, the printed-wiring board 12 of a given kind is provided with the two fiducial marks 204, 222 of different configurations. Where the wiring patterns, land patterns or the like formed on the printed-wiring board are utilized as a plurality of fiducial marks, these fiducial marks located at respective fiducial-mark positions preferably have the same configuration, if possible.

The printed-wiring board may be provided with fiducial marks exclusively formed thereon, rather than the fiducial marks which are constituted by portions of the wiring patterns or land patterns as in the illustrated embodiments. All or some of these exclusively formed fiducial marks may have the same configuration, or all of these fiducial marks may have respective different configurations.

In the illustrated embodiments, the fiducial marks are used to detect the positioning errors of the printed-wiring board 12 on which the fiducial marks are provided. However, fiducial marks may be used to identify the printed-wiring boards, other circuit substrates, or any other members on which the fiducial marks are provided. Namely, the fiducial marks may be used as identifier marks to indicate the specific kinds or types of the members provided with the fiducial marks.

In the electronic-component mounting system 11 to which the illustrated embodiments are applied, the mounting head 100 is moved in the XY plane to mount the electronic components 16 at the predetermined component-mounting spots on the circuit substrate. However, the fiducial-mark searching method and apparatus according to the principle of this invention are equally applicable to an electric-component mounting system of any other types, a screen-printing system or any other high-viscosity fluid applying system, and any other systems wherein fiducial marks are detected. For example, the principle of this invention is applicable to an electric-component mounting system wherein a plurality of mounting heads are carried by an indexing body and are turned about an axis of rotation of the indexing body, so that the mounting heads are successively moved to and stopped at a plurality of working positions such as a component-receiving position at which each mounting head receives an electric component from a component-supplying device, and a component-mounting position at which each mounting head mounts the electric component at the corresponding component-mounting spot on the circuit substrate.

While the presently preferred embodiments of the present invention have been described in detail, for illustrative purpose only, it is to be understood that the present invention may be embodied with various changes and improvements, such as those described in the SUMMARY OF THE INVENTION, which may occur to those skilled in the art.

What is claimed is:

1. A method of searching for a fiducial mark, by processing image data indicative of images of said fiducial mark and an area surrounding said fiducial mark, said images being taken by an imaging device, said method comprising:
a reference-line setting step of setting, by a person practicing the method, at least one two-dimensional reference line each of which corresponds to at least one portion of a profile of said fiducial mark and the number of which is sufficient to specify said fiducial mark, said reference-line setting step comprising selecting said at least one two-dimensional reference line from among a plurality of stored and predetermined two-dimensional candidate reference lines;
a profile-data obtaining step of obtaining profile data indicative of profiles of said images taken by said imaging device, each of said profiles of said images consisting of a group of points at which an optical characteristic of the corresponding image abruptly changes; and
a searching step of searching for said fiducial mark, on the basis of said profiles represented by the obtained profile data and said at least one two-dimensional reference line.

2. The method according to claim 1, wherein said reference-line setting step comprises setting a plurality of two-dimensional reference lines corresponding to respective portions of said profile of said fiducial mark.

3. The method according to claim 2, wherein said reference-line setting step comprises specifying positions of said plurality of two-dimensional reference lines relative to each other.

4. The method according to claim 1, wherein said plurality of stored and predetermined two-dimensional candidate reference lines are selected from a group consisting of: a circle; a circular arc; a polygon; a segment; and a bent line.

5. The method according to claim 1, wherein said reference-line setting step comprises specifying at least one dimension of each of said at least one two-dimensional reference line.

6. The method according to claim 1, wherein said searching step comprises determining one of said profiles represented by said profile data obtained in said profile-data obtaining step, to be a profile of said fiducial mark, if more than a predetermined percentage of said one profile matches said at least one two-dimensional reference line.

7. The method according to claim 1, wherein said fiducial mark is provided on a circuit substrate.

8. A method of detecting a fiducial mark, comprising:
a fiducial-mark searching method according to claim 1; and
a fiducial-mark-position obtaining step of obtaining a position of said fiducial mark which has been searched for by said fiducial-mark searching method.

9. A method of searching for a fiducial mark, by processing image data indicative of images of said fiducial mark and an area surrounding said fiducial mark, said images being taken by an imaging device, said method comprising:
a reference-line setting step of setting, by a person practicing the method, at least one reference line each of which corresponds to at least one portion of a profile of said fiducial mark and the number of which is sufficient to specify said fiducial mark, said reference-line setting step comprising selecting said at least one reference line from among a plurality of stored and predetermined candidate reference lines;
a profile-data obtaining step of obtaining profile data indicative of profiles of said images taken by said imaging device, each of said profiles of said images consisting of a group of points at which an optical characteristic of the corresponding image abruptly changes; and
a searching step of searching for said fiducial mark, on the basis of said profiles represented by the obtained profile data and said at least one reference line, wherein said searching step comprises searching for said fiducial mark, on the basis of said profiles represented by said profile data obtained in said profile-data obtaining step, and said at least one reference line as displaced so as to effect at least one of predetermined permissible ratios of enlargement and contraction of a profile defined by said at least one reference line before displacement thereof.

10. An apparatus for searching for a fiducial mark, comprising an imaging device operable to take images of said fiducial mark and an area surrounding said fiducial mark, and an image-data processing device operable to process image data indicative of said images, said image-data processing device comprising:
a candidate-reference-line data storing portion operable to store a plurality of predetermined two-dimensional candidate reference lines which are used to search for said fiducial mark and from which at least one two-dimensional reference line the number of which is sufficient to specify said fiducial mark is selected, each of said at least one two-dimensional reference line corresponding to at least one portion of a profile of said fiducial mark and the number of which is sufficient to specify said fiducial mark;
a reference-line-data selecting portion operable by an operator of the apparatus to select said at least one two-dimensional reference line from said plurality of predetermined two-dimensional candidate reference lines;
a profile-data obtaining portion operable to obtain profile data indicative of profiles of said images taken by said imaging device, each of said profiles of said images consisting of a group of points at which an optical characteristic of the corresponding image abruptly changes; and
a searching portion operable to search for said fiducial mark, on the basis of said profiles represented by said profile data obtained by said profile-data obtaining portion and said at least one two-dimensional reference line stored in said reference-data storing portion.

11. A method of searching for a fiducial mark, by processing image data indicative of images of said fiducial mark and an area surrounding said fiducial mark, said images being taken by an imaging device, said method comprising:
a reference-line setting step of setting at least one reference line each of which corresponds to at least one portion of a profile of said fiducial mark and the number of which is sufficient to specify said fiducial mark;
a profile-data obtaining step of obtaining profile data indicative of profiles of said images taken by said imaging device, each of said profiles of said images consisting of a group of points at which an optical characteristic of the corresponding image abruptly changes; and a searching step of searching for said fiducial mark, on the basis of said profiles represented by the obtained profile data and said at least one reference line, and wherein said searching step comprises searching for said fiducial mark, on the basis of said profiles represented by said profile data obtained in said profile data obtaining step, and said at least one reference line as displaced so as to effect at least one of predetermined permissible ratios of enlargement and contraction of a profile defined by said at least one reference line before displacement thereof.

* * * * *